(12) United States Patent
Hu et al.

(10) Patent No.: US 12,519,094 B2
(45) Date of Patent: *Jan. 6, 2026

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Hsien-Pin Hu, Hsinchu County (TW); Chin-Fu Kao, Taipei (TW); Li-Hui Cheng, New Taipei (TW); Szu-Wei Lu, Hsinchu (TW); Wen-Hsin Wei, Hsinchu (TW); Chih-Chien Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/870,850

(22) Filed: Jul. 22, 2022

(65) Prior Publication Data
US 2022/0359476 A1 Nov. 10, 2022

Related U.S. Application Data

(63) Continuation of application No. 16/846,400, filed on Apr. 12, 2020, now Pat. No. 11,456,287.
(Continued)

(51) Int. Cl.
*H01L 23/10* (2006.01)
*H01L 21/56* (2006.01)
(Continued)

(52) U.S. Cl.
CPC .......... *H01L 25/165* (2013.01); *H01L 21/561* (2013.01); *H01L 23/053* (2013.01);
(Continued)

(58) Field of Classification Search
CPC .......... H01L 23/043–057; H01L 23/10; H01L 23/16; H01L 25/165; H01L 25/16;
(Continued)

(56) References Cited

U.S. PATENT DOCUMENTS

| 8,115,304 B1 * | 2/2012 | Joshi | ................. H01L 23/49827 |
| | | | 257/E23.116 |
| 9,000,584 B2 | 4/2015 | Lin et al. | |

(Continued)

FOREIGN PATENT DOCUMENTS

| CN | 103855114 | 6/2014 |
| CN | 108933108 | 12/2018 |
| JP | 2007258430 | 10/2007 |

OTHER PUBLICATIONS

Dictionary.com definition of "parallel". (Year: 2024).*

*Primary Examiner* — Yu Chen
(74) *Attorney, Agent, or Firm* — JCIPRNET

(57) ABSTRACT

A package structure includes a circuit substrate, a semiconductor package, a lid structure, a passive device and a barrier structure. The semiconductor package is disposed on and electrically connected to the circuit substrate. The lid structure is disposed on the circuit substrate covering the semiconductor package. The lid structure is attached to the circuit substrate through an adhesive material. The passive device is disposed on the circuit substrate in between the semiconductor package and the lid structure. The barrier structure is separating the passive device from the lid structure and the adhesive material, and the barrier structure is in contact with the adhesive material.

20 Claims, 19 Drawing Sheets

Related U.S. Application Data

(60) Provisional application No. 62/892,563, filed on Aug. 28, 2019.

(51) Int. Cl.
| | |
|---|---|
| *H01L 23/053* | (2006.01) |
| *H01L 23/16* | (2006.01) |
| *H01L 23/498* | (2006.01) |
| *H01L 25/16* | (2023.01) |
| H01L 21/48 | (2006.01) |
| H01L 21/683 | (2006.01) |
| H01L 23/538 | (2006.01) |
| H01L 25/065 | (2023.01) |

(52) U.S. Cl.
CPC .............. *H01L 23/10* (2013.01); *H01L 23/16* (2013.01); *H01L 23/49816* (2013.01); *H01L 21/486* (2013.01); *H01L 21/563* (2013.01); *H01L 21/6835* (2013.01); *H01L 23/5385* (2013.01); *H01L 25/0655* (2013.01); *H01L 2924/16152* (2013.01); *H01L 2924/16251* (2013.01); *H01L 2924/1631* (2013.01); *H01L 2924/1632* (2013.01)

(58) Field of Classification Search
CPC ............ H01L 25/10–117; H01L 25/03; H01L 2924/16251; H01L 2924/163–16598; H01L 2924/16152; H01L 2924/16153; H01L 2924/19105; H01L 25/042; H01L 25/0655; H01L 25/072; H01L 25/0753; H01L 25/162; H01L 2224/02135; H01L 2224/02175; H01L 2224/02245; H01L 2224/03013; H01L 2224/10145; H01L 2224/10175; H01L 2224/11013; H01L 2224/24992; H01L 2224/24997; H01L 2224/26145; H01L 2224/26175; H01L 2224/27013

See application file for complete search history.

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,456,287 B2 * | 9/2022 | Hu .................. H01L 23/49816 |
| 2005/0082682 A1 | 4/2005 | Liu |
| 2006/0060985 A1 * | 3/2006 | Furtaw .................. H01L 23/564 |
| | | 257/E23.193 |
| 2011/0133321 A1 | 6/2011 | Ihara |
| 2011/0147912 A1 | 6/2011 | Karpur et al. |
| 2016/0163657 A1 * | 6/2016 | Hung .................. H01L 23/562 |
| | | 438/126 |

* cited by examiner

PACKAGE STRUCTURE AND METHOD OF FABRICATING THE SAME

CROSS-REFERENCE TO RELATED APPLICATION

This application is a continuation application of U.S. application Ser. No. 16/846,400, filed on Apr. 12, 2020, now allowed. The prior application Ser. No. 16/846,400 claims the priority benefit of U.S. provisional application Ser. No. 62/892,563, filed on Aug. 28, 2019. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
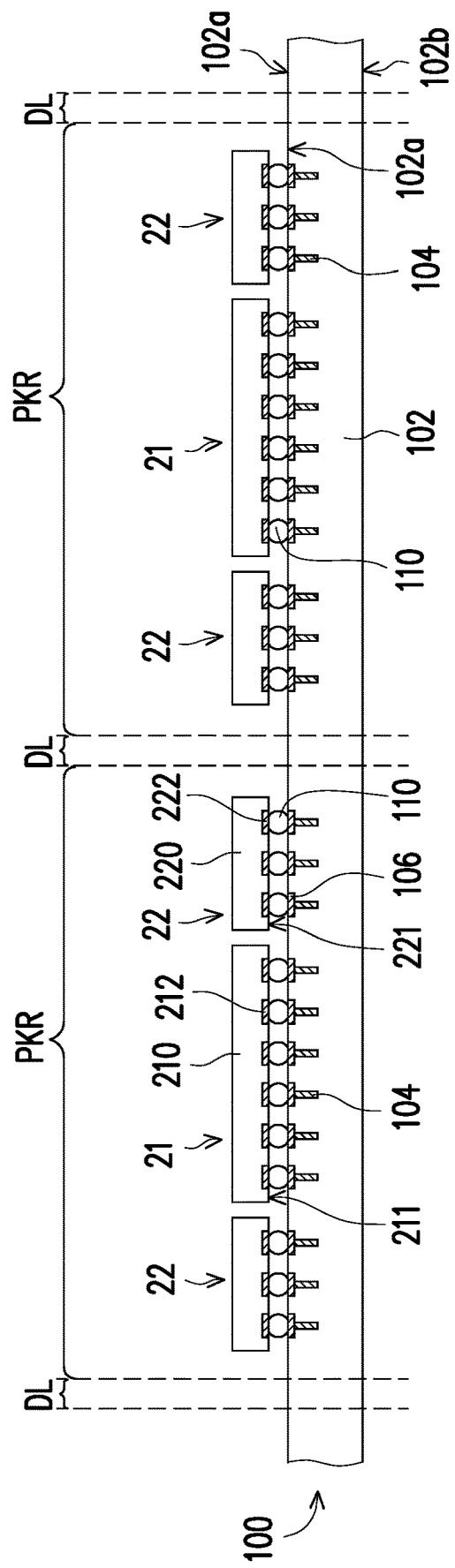
FIG. 1A to FIG. 1G are schematic sectional views of various stages in a method of fabricating a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

With the gradual increase in size of semiconductor packages (such as chip-on-wafer (CoW) structure) on the circuit substrate, the enclosure width between passive devices and an adhesive material of the lid structure becomes limited. In other words, the space between passive devices and the adhesive material is decreased, and there is a risk that the adhesive material will come in contact with the passive device. As a result, function failure of the passive device may be induced. In addition, tin (Sn) whisker on the passive devices may also come in contact with the lid structure, resulting in electrical failure. In a package structure according to the exemplary embodiments of the present disclosure, it includes at least one barrier structure that separates the passive device from the lid structure and the adhesive material. As such, bleeding or spreading of the adhesive material towards the passive device may be avoided, thus the electrical failure and/or function failure of the passive device can be prevented.

FIG. 1A to FIG. 1G are schematic sectional views of various stages in a method of fabricating a semiconductor package according to some exemplary embodiments of the present disclosure. Referring to FIG. 1A, an interposer structure 100 is provided. In some embodiments, the interposer structure 100 includes a core portion 102, and a plurality of through vias 104 and conductive pads 106 formed therein. In some embodiments, the core portion 102 is a substrate such as a bulk semiconductor substrate, silicon on insulator (SOI) substrate or a multi-layered semiconductor material substrate. The semiconductor material of the substrate (core portion 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 102 is doped or undoped.

In some embodiments, the conductive pads 106 are formed on a first surface 102a of the core portion 102. In some embodiments, through vias 104 are formed in the core portion 102 and connected with the conductive pads 106. In some embodiments, the through vias 104 extend into the core portion 102 with a specific depth. In some embodiments, the through vias 104 are through-substrate vias. In some embodiments, the through vias 104 are through-silicon vias when the core portion 102 is a silicon substrate. In some embodiments, the through vias 104 may be formed by forming holes or recesses in the core portion 102 and then filling the recesses with a conductive material. In some embodiments, the recesses may be formed by, for example, etching, milling, laser drilling or the like. In some embodiments, the conductive material may be formed by an electrochemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 106 connected with the through vias 104 may be formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes passive devices formed in the core portion 102.

As shown in FIG. 1A, the core portion 102 has a plurality of package regions PKR and a dicing lane DL separating each of the plurality of package regions PKR. The through vias 104 and conductive pads 106 are formed in the core portion 102 within the package regions PKR. In some embodiments, the semiconductor dies 21 and semiconductor dies 22 are provided on the interposer structure 100, or on the core portion 102 within the package regions PKR. The semiconductor dies 21 and semiconductor dies 22 are individual dies singulated from a wafer. In some embodiments, the semiconductor dies 21 contain the same circuitry, such as devices and metallization patterns, or the semiconductor dies 21 are the same type of dies. In some embodiments, the semiconductor dies 22 contain the same circuitry, or the semiconductor dies 22 are the same type of dies. In certain embodiments, the semiconductor dies 21 and the semiconductor dies 22 have different circuitry or are different types of dies. In alternative embodiments, the semiconductor dies 21 and the semiconductor dies 22 may have the same circuitry.

In some embodiments, the semiconductor dies 21 may be major dies, while the semiconductor dies 22 are tributary dies. In some embodiments, the major dies are arranged on the core portion 102 in central locations of each package region PKR, while tributary dies are arranged side-by-side and spaced apart from the major dies. In some embodiments, the tributary dies are arranged aside the major dies, and around or surrounding the major dies. In one embodiment, four or six tributary dies are arranged around one major die per one package region PKR.

In certain embodiments, the semiconductor dies 21 has a surface area larger than that of the semiconductor dies 22. Also, in some embodiments, the semiconductor dies 21 and the semiconductor dies 22 may be of different sizes, including different surface areas and/or different thicknesses. In some embodiments, the semiconductor dies 21 may be a logic die, including a central processing unit (CPU) die, graphics processing unit (GPU) die, system-on-a-chip (SoC) die, a microcontroller or the like. In some embodiments, the semiconductor dies 21 is a power management die, such as a power management integrated circuit (PMIC) die. In some embodiments, the semiconductor dies 22 may be a memory die, including dynamic random access memory (DRAM) die, static random access memory (SRAM) die or a high bandwidth memory (HBM) die. The disclosure is not limited thereto, and the number, sizes and types of the semiconductor die disposed on the core portion 102 may be appropriately adjusted based on product requirement.

As illustrated in FIG. 1A, the semiconductor dies 21 include a body 210 and connecting pads 212 formed on an active surface 211 of the body 210. In certain embodiments, the connecting pads 212 may further include pillar structures for bonding the semiconductor dies 21 to other structures. In some embodiments, the semiconductor dies 22 include a body 220 and connecting pads 222 formed on an active surface 221 of the body 220. In other embodiments, the connecting pads 222 may further include pillar structures for bonding the dies 22 to other structures.

In some embodiments, the semiconductor dies 21 and the semiconductor dies 22 are attached to the first surface 102a of the core portion 102, for example, through flip-chip bonding by way of the electrical connectors 110. Through the reflow process, the electrical connectors 110 are formed between the connecting pads 212, 222 and conductive pads 106, electrically and physically connecting the semiconductor dies 21, 22 to the core portion 102 of the interposer structure 100. In some embodiments, the electrical connectors 110 are located in between the semiconductor dies 21, 22 and the interposer structure 100. In certain embodiments, semiconductor dies 21, 22 are electrically connected to the through vias 104 and the conductive pads 106 through the electrical connectors 110. In one embodiment, the electrical connectors 110 are micro-bumps, such as micro-bumps having copper metal pillars. In another embodiment, the electrical connectors 110 are solder bumps, lead-free solder bumps, or micro bumps, such as controlled collapse chip connection (C4) bumps or micro bumps containing copper pillars. In some embodiments, the bonding between the semiconductor dies 21, 22 and the core portion 102 may be solder bonding. In some embodiments, the bonding between the semiconductor dies 21, 22 and the core portion 102 may be direct metal-to-metal bonding, such as copper-to-copper bonding.

Figure 1B:
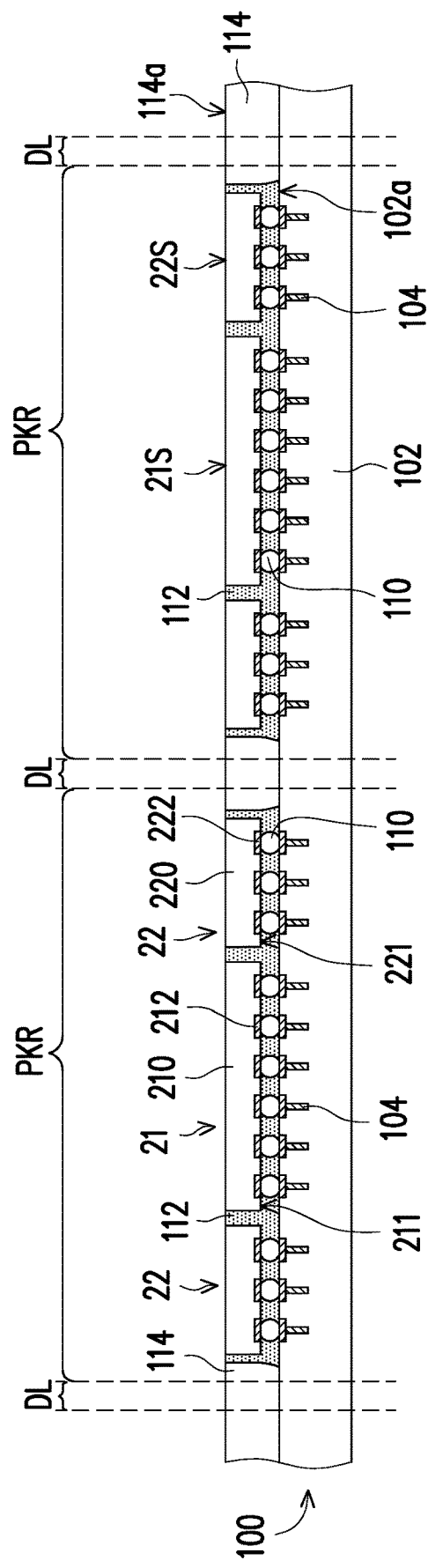

Referring to FIG. 1B, in a next step, an underfill structure 112 may be formed to cover the plurality of electrical connectors 110, and to fill up the spaces in between the semiconductor dies 21, 22 and the interposer structure 100. In some embodiments, the underfill structure 112 further cover side walls of the semiconductor dies 21, 22, and is located within the package region PKR. Thereafter, an insulating encapsulant 114 may be formed over the interposer structure 100 (or over the core portion 102) to cover the underfill structure 112, and to surround the semiconductor dies 21 and 22.

In some embodiments, the insulating encapsulant 114 is formed on the first surface 102a of the core portion 102 in the package regions PKR and over the dicing lanes DL. In some embodiments, the insulating encapsulant 114 is formed through, for example, a compression molding process or transfer molding. In one embodiment, a curing process is performed to cure the insulating encapsulant 114. In some embodiments, the semiconductor dies 21, 22 and the electrical connectors 110 are encapsulated by the insulating encapsulant 114. In some embodiments, a planarization process, including grinding or polishing, may be performed to partially remove the insulating encapsulant 114, exposing backside surfaces 21S, 22S of the semiconductor dies 21, 22. Accordingly, the backside surfaces 21S, 22S of the semiconductor dies 21, 22 are levelled with a top surface 114a of the insulating encapsulant 114. The top surface 114a being opposite to a backside surface 114b of the insulating encapsulant 114, wherein the backside surface 114b is in contact with the core portion 102.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 1C:
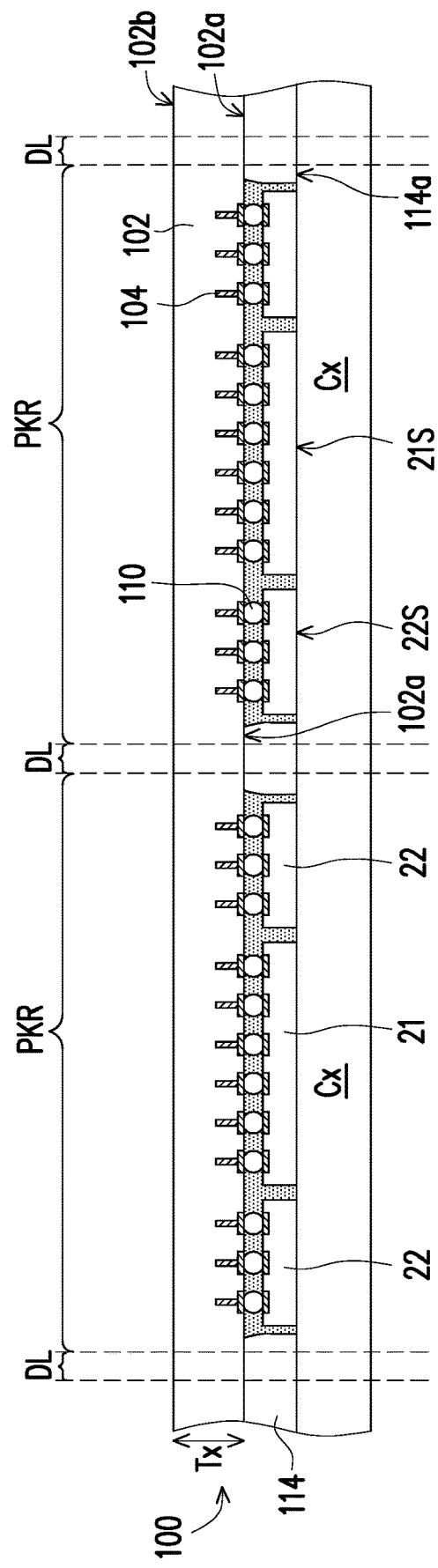

Referring to FIG. 1C, the structure of FIG. 1B is turned upside down or flipped, and placed on a carrier Cx, so that the carrier Cx directly contacts the backside surfaces 21S, 22S of the semiconductor dies 21, 22 and the top surface 114a of the insulating encapsulant 114. As shown in FIG. 1C, at this stage of processing, the interposer structure 100 has not been thinned and has a thickness Tx. In other words, the through vias 104 are not revealed, and are embedded in the core portion 102 of the interposer structure 100.

Figure 1D:
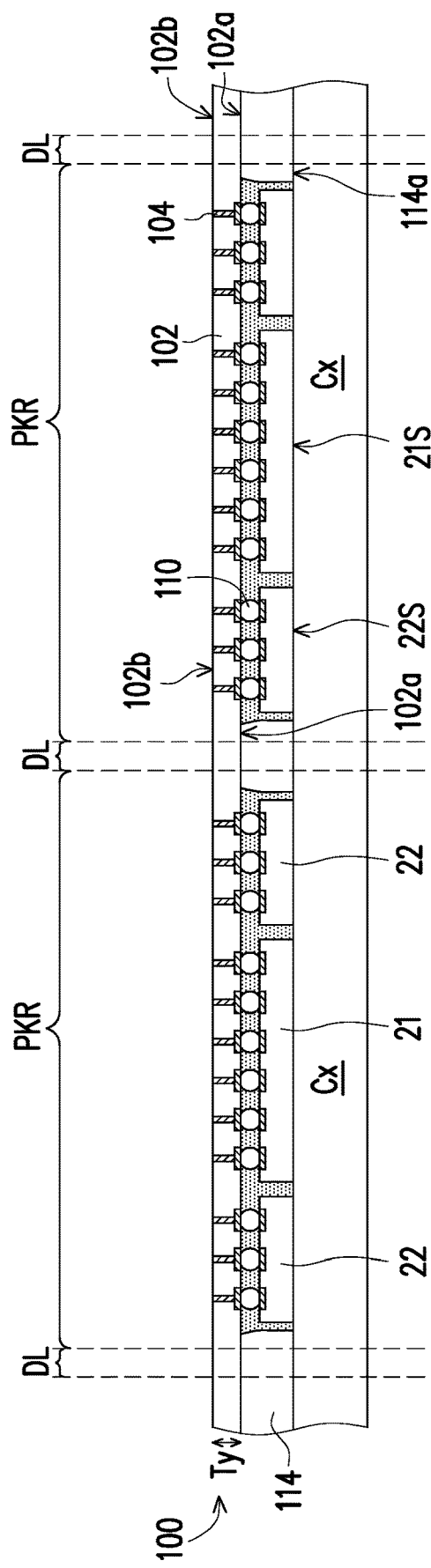

Referring to FIG. 1D, a thinning process is performed to the interposer 100 to partially remove or thin the core portion 102 of the interposer structure 100 until the through vias 104 are exposed and a second surface 102b of the core portion 102 is formed. In some embodiments, the thinning process may include a back-grinding process, a polishing process or an etching process. In some embodiments, after the thinning process, the interposer structure 100 is thinned to a thickness Ty. In some embodiments, a ratio of the thickness Ty to the thickness Tx ranges from about 0.1 to about 0.5.

Figure 1E:
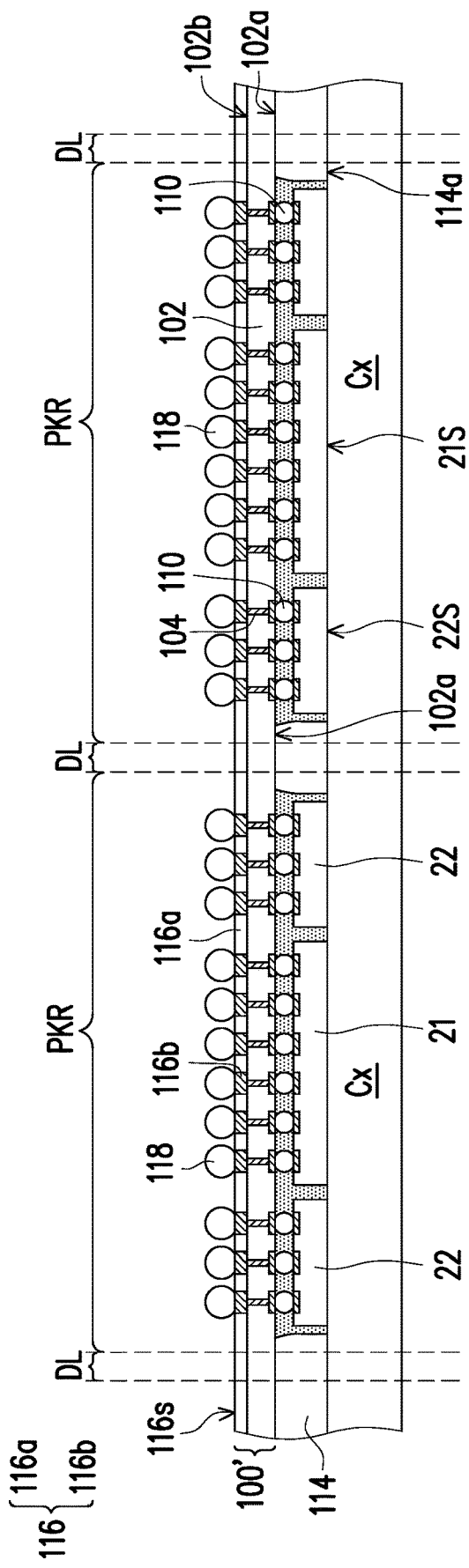

Referring to FIG. 1E, a redistribution structure 116 is formed on the second surface 102b of the core portion 102 in the package region PKR and over the dicing lanes DL. The second surface 102b being opposite to the first surface 102a of the core portion 102. In some embodiments, the redistribution structure 116, the core portion 102, the through vias 104 and conductive pads 106 constitutes the interposer structure 100'. In some embodiments, the redistribution structure 116 electrically connects the through vias 104 and/or electrically connects the through vias 104 with external devices. In certain embodiments, the redistribution structure 116 includes at least one dielectric layer 116a and metallization patterns 116b in the dielectric layer 116a. In some embodiments, the metallization patterns 116b may comprise pads, vias and/or trace lines to interconnect the through vias 104 and to further connect the through vias 104 to one or more external devices. Although one layer of dielectric layer 116a, and one layer of the metallization patterns 116b is shown in FIG. 1E, it should be noted that the number of layers of the dielectric layer 116a and the metallization patterns 116b is not limited thereto, and could be adjusted based on requirement.

In some embodiments, the material of the dielectric layer 116a comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 116a may be formed by spin-coating or deposition, including chemical vapor deposition (CVD), PECVD, HDP-CVD, or the like. In some embodiments, the metallization patterns 116b include under-metal metallurgies (UBMs). In some embodiments, the formation of the metallization patterns 116b may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 116b includes copper, aluminum, tungsten, silver, and combinations thereof.

As illustrated in FIG. 1E, a plurality of conductive terminals 118 is disposed on the metallization patterns 116b, and are electrically coupled to the through vias 104. In some embodiments, the conductive terminals 118 are placed on the top surface 116s of the redistribution structure 116, and electrically connected to the through vias 104 by the metallization patterns 116b within the package region PKR. In certain embodiments, the conductive terminals 118 are positioned on and physically attached to the metallization patterns 116b. In some embodiments, the conductive terminals 118 include lead-free solder balls, solder balls, ball grid array (BGA) balls, bumps, C4 bumps or micro bumps. In some embodiments, the conductive terminals 118 may include a conductive material such as solder, copper, aluminum, gold, nickel, silver, palladium, tin, or a combination thereof. In some embodiments, the conductive terminals 118 are formed by forming the solder paste on the redistribution structure 116 by, for example, evaporation, electroplating, printing or solder transfer and then reflowed into the desired bump shapes. In some embodiments, the conductive terminals 118 are placed on the redistribution structure 116 by ball placement or the like. In other embodiments, the conductive terminals 118 are formed by forming solder-free metal pillars (such as a copper pillar) by sputtering, printing, electroless or electro plating or CVD, and then forming a lead-free cap layer by plating on the metal pillars. The conductive terminals 118 may be used to bond to an external device or an additional electrical component. In some embodiments, the conductive terminals 118 are used to bond to a circuit substrate, a semiconductor substrate or a packaging substrate.

Figure 1F:
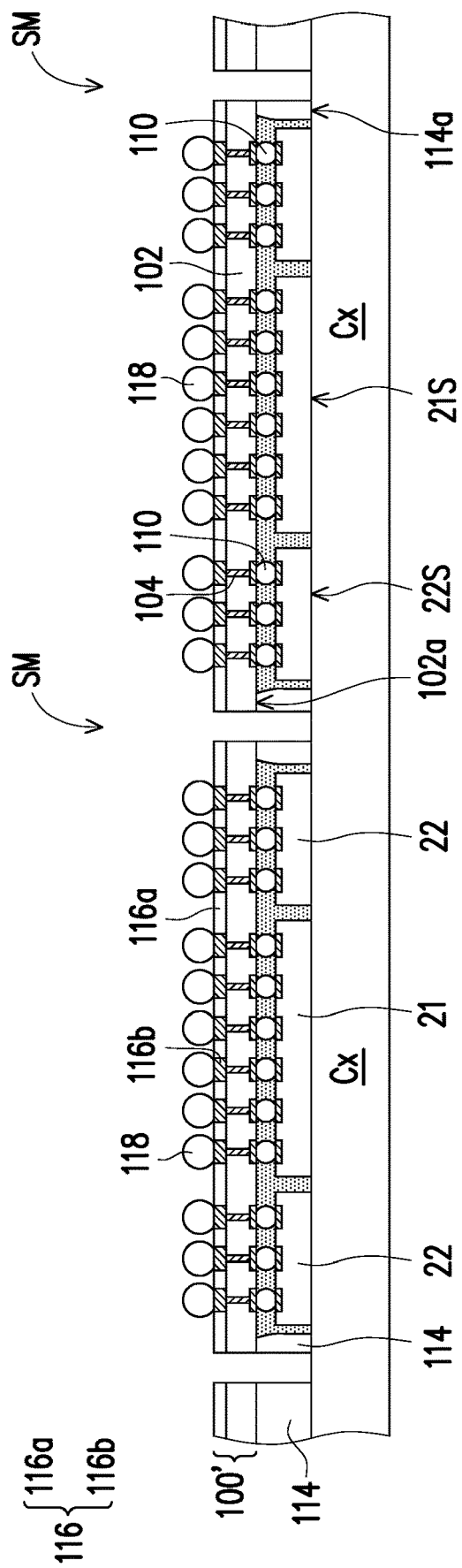

Referring to FIG. 1F, in a next step, the structure shown in FIG. 1E is diced or singulated along the dicing lanes DL to form a plurality of semiconductor packages SM. For example, the dicing process is performed to cut through the redistribution structure 116, the core portion 102, and the insulating encapsulant 114 to remove portions of the redistribution structure 116, the core portion 102, and the insulating encapsulant 114 along the dicing lanes DL. In some embodiments, the dicing process or the singulation process typically involves dicing with a rotating blade or a laser beam. In other words, the dicing or singulation process is, for example, a laser cutting process, a mechanical sawing process, or other suitable processes. In some embodiments, the dicing process or the singulation process may be performed on a tape (e.g. dicing tape) supported by a frame (not shown). In other words, the carrier Cx may be de-bonded, and the structure is transferred onto the dicing tape so as to perform the dicing process. After debonding the carrier Cx and performing the dicing process, the singulated semiconductor package SM illustrated in FIG. 1G can be obtained.

Figure 1G:
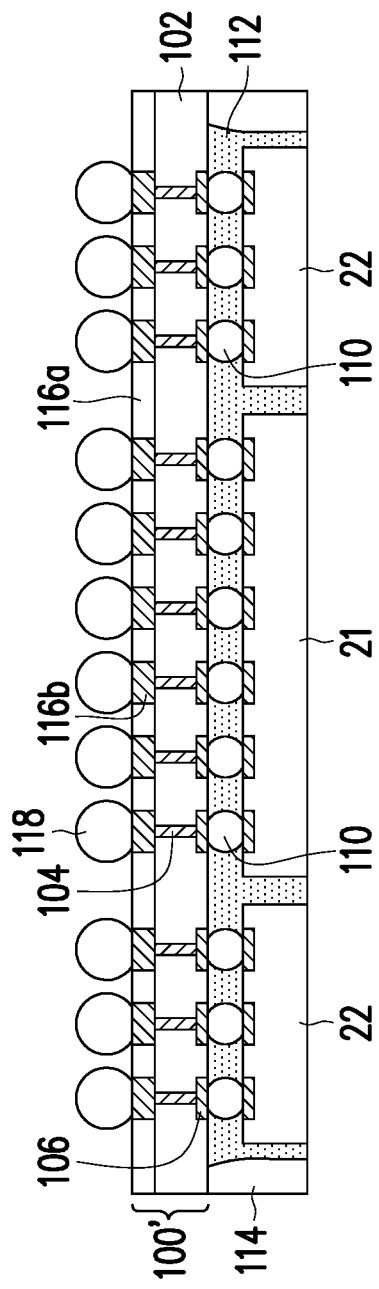
Figure 2A:
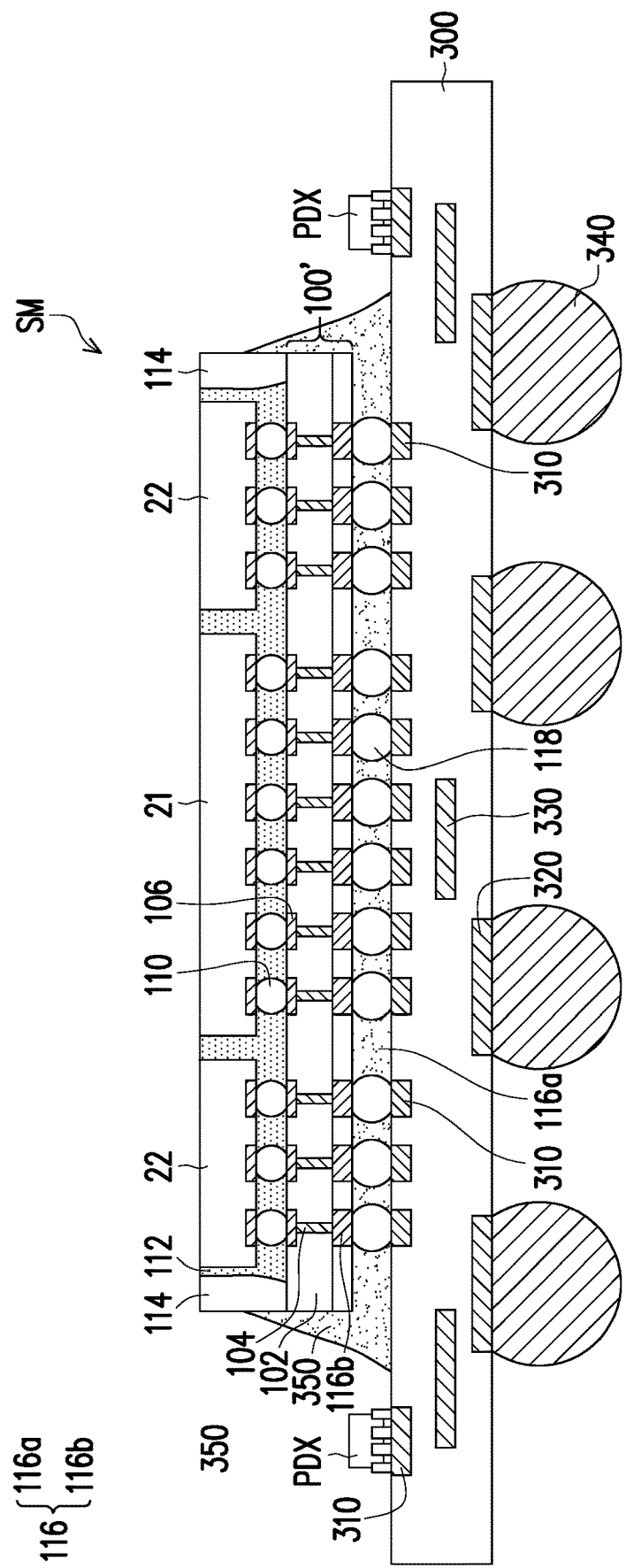
FIG. 2A to FIG. 2C are schematic sectional views of various stages in a method of fabricating a package structure according to some exemplary embodiments of the present disclosure.
Figure 2B:
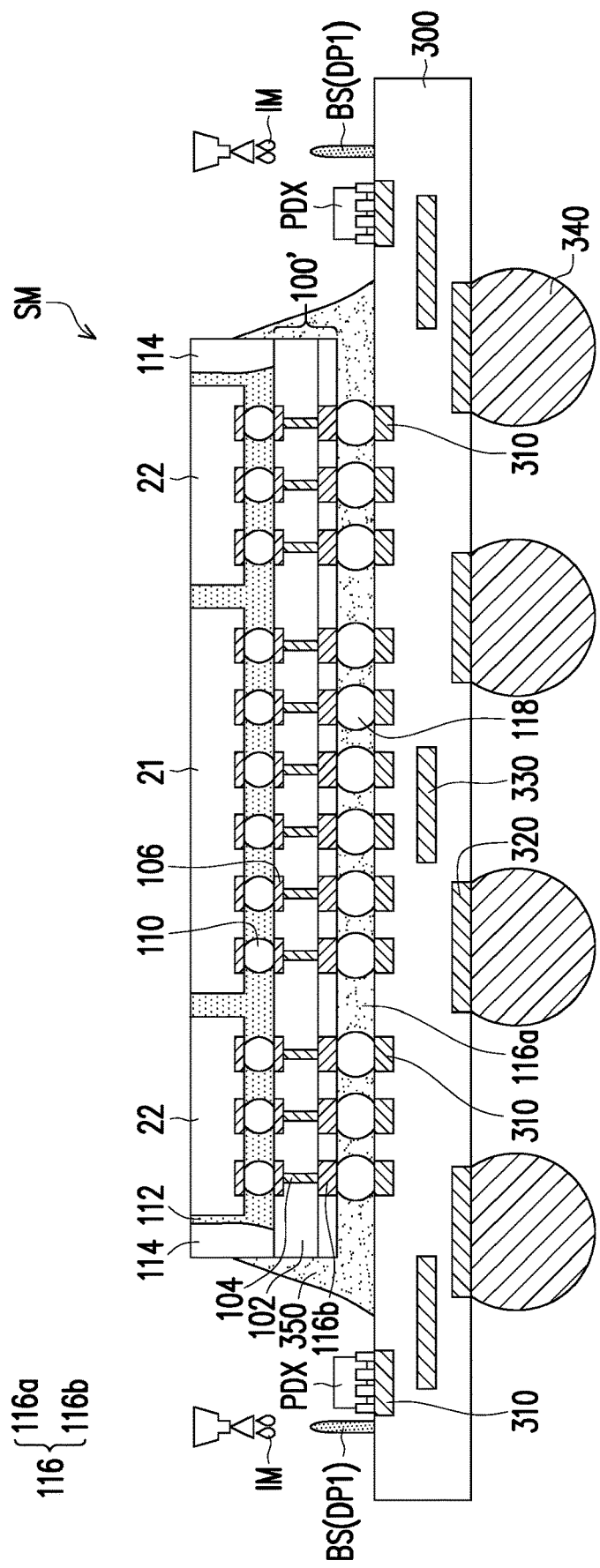
Figure 2C:
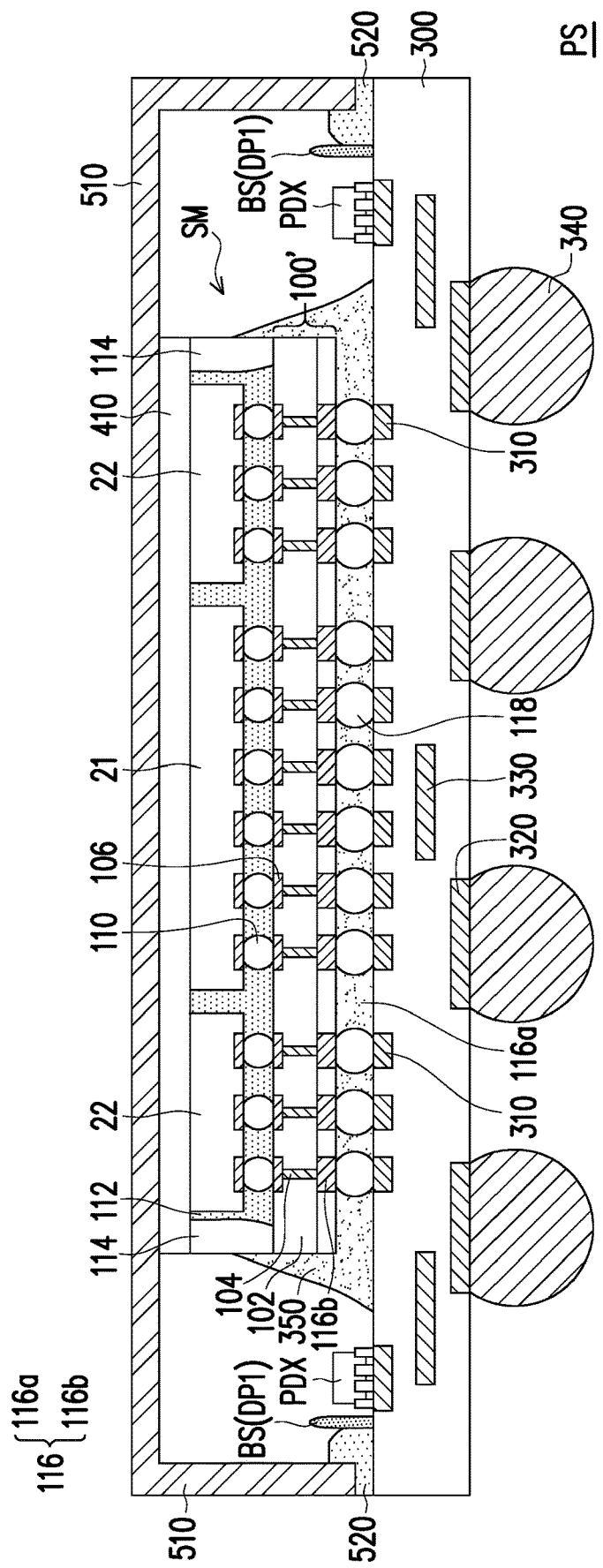

FIG. 2A to FIG. 2C are schematic sectional views of various stages in a method of fabricating a package structure according to some exemplary embodiments of the present disclosure. Referring to FIG. 2A, in the exemplary embodiment, the semiconductor package SM obtained in FIG. 1G is mounted or attached onto a circuit substrate 300 through the conductive terminals 118. In some embodiments, the circuit substrate 300 includes contact pads 310, contact pads 320, metallization layers 330, and vias (not shown). In some embodiments, the contact pads 310 and the contact pads 320 are respectively distributed on two opposite sides of the circuit substrate 300, and are exposed for electrically connecting with later-formed elements/features. In some embodiments, the metallization layers 330 and the vias are embedded in the circuit substrate 300 and together provide routing function for the circuit substrate 300, wherein the metallization layers 330 and the vias are electrically connected to the contact pads 310 and the contact pads 320. In other words, at least some of the contact pads 310 are electrically connected to some of the contact pads 320 through the metallization layers 330 and the vias. In some embodiments, the contact pads 310 and the contact pads 320 may include metal pads or metal alloy pads. In some embodiments, the materials of the metallization layers 330 and the vias may be substantially the same or similar to the material of the contact pads 310 and the contact pads 320.

Furthermore, in some embodiments, the semiconductor package SM is bonded to the circuit substrate 300 through physically connecting the conductive terminals 118 and the contact pads 310 to form a stacked structure. In certain embodiments, the semiconductor package SM is electrically connected to the circuit substrate 300. In some embodiments, the circuit substrate 300 is such as an organic flexible substrate or a printed circuit board. In such embodiments, the conductive terminals 118 are, for example, chip connectors. In some embodiments, a plurality of conductive balls 340 are respectively formed on the substrate 300. As illustrated in FIG. 2A, for example, the conductive balls 340 are connected to the contact pads 320 of the circuit substrate 300. In other words, the conductive balls 340 are electrically connected to the circuit substrate 300 through the contact pads 320. Through the contact pads 310 and the contact pads 320, some of the conductive balls 340 are electrically connected to the semiconductor package SM (e.g. the semiconductor dies 21 and 22 included therein). In some embodiments, the conductive balls 340 are, for example, solder balls or BGA balls. In some embodiments, the semiconductor package SM is bonded to the circuit substrate 300 through physically connecting the conductive terminals 118 and the contact pads 310 of the circuit substrate 300 by a chip on wafer on substrate (CoWoS) packaging processes. In addition, as illustrated in FIG. 2A, passive devices PDx (integrated passive device or surface mount devices) may be mounted on the circuit substrate 300. For example, the passive devices PDx may be mounted on the contact pads 310 of the circuit substrate 300 through a soldering process. The disclosure is not limited thereto. In certain embodiments, the passive devices PDx may be mounted on the circuit substrate surrounding the semiconductor package SM.

As further illustrated in FIG. 2A, in some embodiments, an underfill structure 350 is formed to fill up the spaces in between the circuit substrate 300 and the semiconductor package SM. In certain embodiments, the underfill structure 350 fills up the spaces in between adjacent conductive terminals 118 and covers the conductive terminals 118. For example, the underfill structure 350 surrounds the plurality of conductive terminals 118. In some embodiments, the passive devices PDx is exposed by the underfill structure 350, and kept a distance apart from the underfill structure 350. In other words, the underfill structure 350 does not cover the passive devices PDx.

Generally, the semiconductor package SM will be further protected by a lid structure, which is attached to the circuit substrate 300 by an adhesive. It is desirable to avoid contact between the adhesive and the passive devices PDx. Dam or barrier structures that act to block encroachment by the adhesive toward the passive devices PDx are illustrated in FIG. 2B to FIG. 13. As an added benefit, certain of the barrier structures further act to mitigate growth of tin whiskers from the passive devices PDx, which may contact the lid structure and cause device failure due to a short circuit. Such structures are shown in FIG. 7, FIG. 10 and FIG. 12, for example.

Referring to FIG. 2B, in a next step, a barrier structure BS (or first dam portion DP1) is formed on the circuit substrate 300 by inkjet printing or other suitable deposition process. For example, in some embodiments, a polymer ink material IM is dispensed on the circuit substrate 300, and the polymer ink material IM is then cured to form the barrier structure BS (first dam portion DP1). In certain embodiments, after dispensing the polymer ink material IM, the polymer ink material is cured through the irradiation of ultraviolet light. In some embodiments, the polymer ink material IM is dispensed on the circuit substrate 300 in an area located in between the passive devices PDx and the lid structure 510 (provided in subsequent step) and spaced apart from the passive devices PDx and the lid structure 510. In some embodiments, the polymer ink material IM is a polyimide-based polymeric material, an epoxy-based polymeric material, or any other polymeric-based materials. However, the disclosure is not limited thereto, and any other suitable materials may be used to form the barrier structure BS as long as it provides sufficient barrier function without affecting the performance of the passive devices PDx.

Referring to FIG. 2C, in some embodiments, a lid structure 510 is attached onto the circuit substrate 300 through an adhesive material 520. For example, the lid structure 510 is disposed on the circuit substrate 300 and surrounds the semiconductor package SM and the passive devices PDx. In some embodiments, the adhesive material 520 is a conductive adhesive, but the disclosure is not limited thereto. In alternative embodiments, the adhesive material 520 may be any other suitable adhesive materials as long as the attachment of the lid structure 510 onto the circuit substrate 300 may be achieved.

In some embodiments, the lid structure 510 may be a heat sink used for heat dissipation. In some embodiments, a thermal interface metal 410 is attached on a backside of the semiconductor package SM and sandwiched between the lid structure 510 and the semiconductor package SM. In certain embodiments, the thermal interface metal 410 fills up the space in between the semiconductor package SM and the lid structure 510 so as to further enhance heat dissipation.

In the exemplary embodiment, when the lid structure 510 is attached to the circuit substrate 300 through the adhesive material 520, bleeding of the adhesive material 520 might occur. The adhesive material 520 may spread towards a direction where the passive devices PDx and the semiconductor package SM are located. In some embodiments, since the barrier structure BS (first dam portion DP1) is disposed in between the passive devices PDx and the lid structure 520, the spreading or bleeding of the adhesive material 520 is blocked by the barrier structure BS (first dam portion DP 1). That is, the barrier structure BS (first dam portion DP1) separates the passive devices PDx from the lid structure 510 and the adhesive material 520, while being in contact with the adhesive material 520. In certain embodiments, the barrier structure BS (first dam portion DP1) is spaced apart from the passive device PDx and the lid structure 510 by a certain distance, so as to prevent overspreading of the adhesive material 520. By using the barrier structure BS to prevent the spreading of the adhesive material 520 towards the passive device PDx, electrical failure and/or function failure of the passive device PDx may be prevented. The structure shown in FIG. 2C can be considered a package structure PS according to some embodiments of the present disclosure.

In the above embodiment, the barrier structure BS is illustrated as a dam-like portion (first dam portion DP1). Various other designs of the barrier structure BS are described in the following sections.

Figure 3:
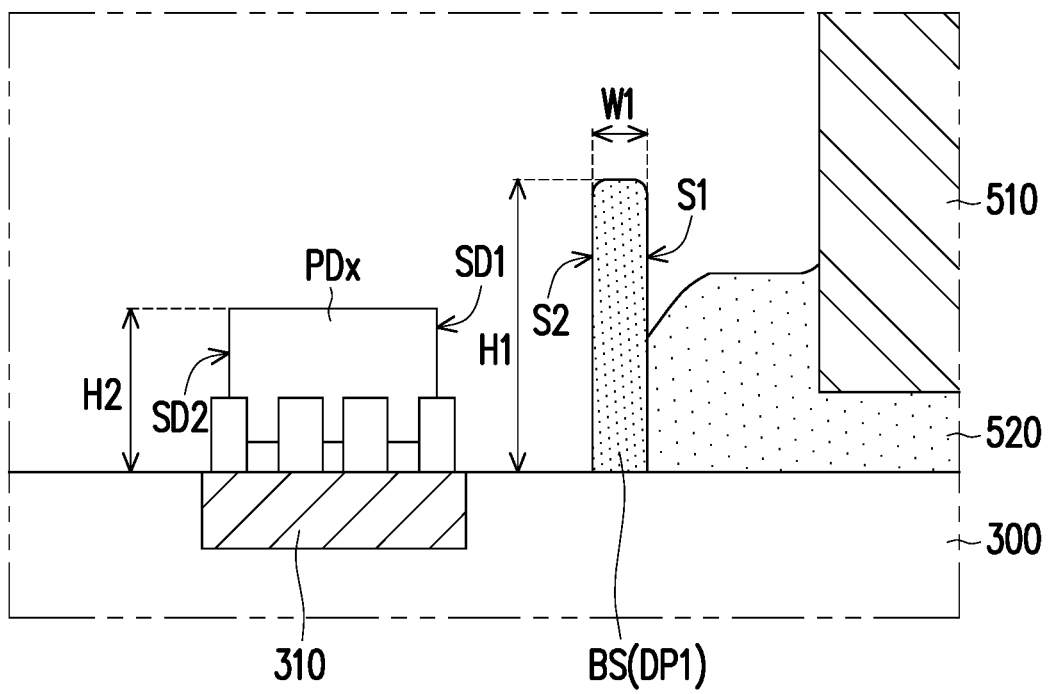
FIG. 3 is an enlarged sectional view of a package structure according to some exemplary embodiments of the present disclosure.

FIG. 3 is an enlarged sectional view of a package structure according to some exemplary embodiments of the present disclosure. For example, FIG. 3 is an enlarged view of the package structure PS shown in FIG. 2C, hence, the same reference numerals are used to refer to the same or like parts, and its detailed description will not be repeated herein. Referring to FIG. 3, the barrier structure BS includes a first dam portion DP1 located in between the passive device PDx and the lid structure 510. In some embodiments, the first dam portion DP1 has a first sidewall S1 that faces the lid structure 510, and a second sidewall S2 opposite to the first sidewall S1 that faces the passive device PDx. For example, the first sidewall S1 of the first dam portion is in contact with the adhesive material 520 to block the adhesive material 520. Furthermore, in some embodiments, the passive device PDx has a first surface SD1 that faces the lid structure 510, and a second surface SD2 opposite to the first surface SD1 that faces the interposer structure 100' (as illustrated in FIG. 2C).

In the exemplary embodiment, a width W1 of the first dam portion DP1 is kept substantially constant from bottom to top of the first dam portion DP1. In certain embodiments, the width W1 is in a range of 5 μm to 3000 μm, which may be adjusted based on design requirement. In some embodiments, when the width W1 is less than 5 μm, it introduces undesired process non-uniformity, or insufficient adhesion strength to the circuit substrate 300 such that the first dam portion DP1 breaks under stress from the adhesive material 520. In some embodiments a height H1 of the first dam portion DP1 is greater than a height H2 of the passive device PDx. Similar to the embodiment above, since the first dam portion DP1 prevents the spreading of the adhesive material 520 towards the passive device PDx, therefore, electrical failure and/or function failure of the passive device PDx may be prevented.

Figure 4:
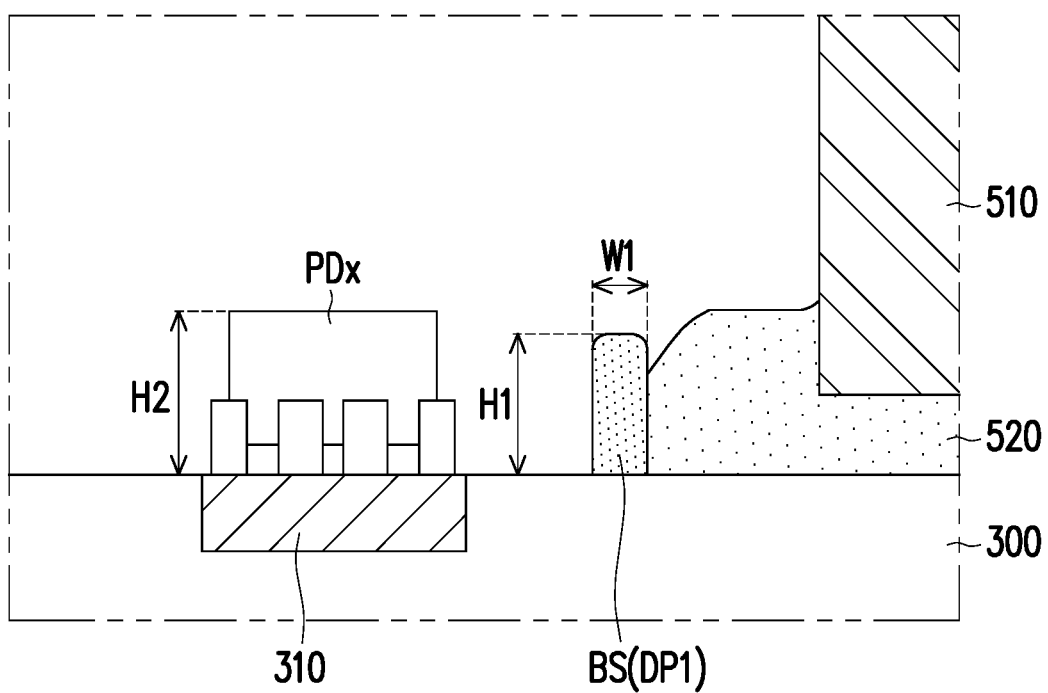
FIG. 4 is an enlarged sectional view of a package structure according to some other exemplary embodiments of the present disclosure.

FIG. 4 is an enlarged sectional view of a package structure according to some other exemplary embodiments of the present disclosure. The embodiment shown in FIG. 4 is similar to the embodiment shown in FIG. 3, hence the same reference numerals are used to refer to the same or liked parts, and its detailed description will not be repeated herein. In the configuration shown in FIG. 3, height H1 of the first dam portion DP1 is shown to be greater than the height H2 of the passive device PDx. However, the disclosure is not limited thereto. As illustrated in FIG. 4, a height H1 of the first dam portion DP1 is less than a height H2 of the passive device PDx. In some embodiments, when a distance between the first dam portion DP1 and the lid structure 510 is increased, the height of the first dam portion DP1 may be decreased. As the first dam portion DP1 is arranged further away from the lid structure 510, the spreading of the adhesive material 520 may become less apparent towards the first dam portion DP1. In other words, due to more spacing of the first dam portion DP1 from the lid structure 510, the adhesive material 520 spreads further, leading to a lower height of the spread adhesive material 520. As such, the height of the first dam portion DP1 may be decreased due to the limited spreading of the adhesive materials 520. In some alternative embodiments, the height of the first dam portion DP1 may be substantially equal to the height of the passive device PDx. In certain embodiments, a height of the barrier structure BS (or first dam portion DP1) may be in a range of 10 μm to 2000 μm, which may be adjusted based on design requirement. Similar to the embodiments above, since the first dam portion DP1 prevents the spreading of the adhesive material 520 towards the passive device PDx, therefore, electrical failure and/or function failure of the passive device PDx may be prevented.

Figure 5:
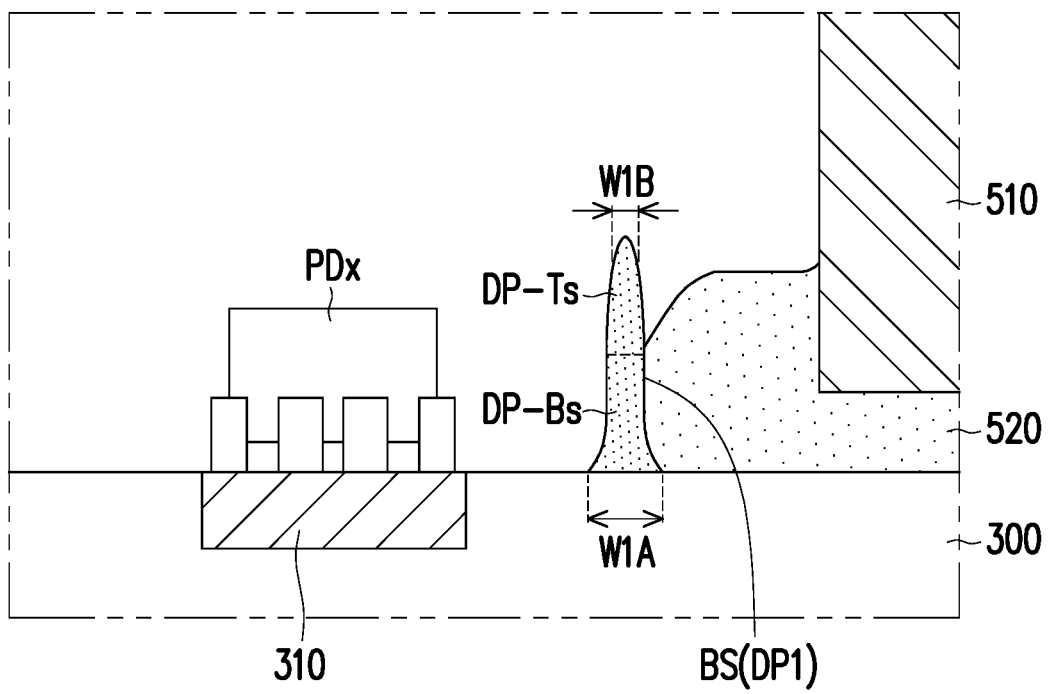
FIG. 5 is an enlarged sectional view of a package structure according to some other exemplary embodiments of the present disclosure.

FIG. 5 is an enlarged sectional view of a package structure according to some other exemplary embodiments of the present disclosure. The embodiment shown in FIG. 5 is similar to the embodiment shown in FIG. 3, hence the same reference numerals are used to refer to the same or liked parts, and its detailed description will not be repeated herein. As illustrated in FIG. 5, the first dam portion DP1 may include a bottom section DP-Bs and a top section DP-Ts joined with the bottom section DP-Bs. In the illustrated embodiment, a width of the first dam portion DP1 decreases from the bottom section DP-Bs to the top section DP-Ts. For example, in some embodiments, the bottom of the bottom section DP-Bs may have a width of W1A, while the top of the top section DP-Ts may have a width of W1B, and the width of the first dam portion DP1 decreases from W1A to W1B. In some embodiments, the shape or dimensions of the first dam portion DP1 may be adjusted by controlling the amount and time periods for dispensing and curing of the polymer ink material. Similar to the embodiments above, since the first dam portion DP1 prevents the spreading of the adhesive material 520 towards the passive device PDx, therefore, electrical failure and/or function failure of the passive device PDx may be prevented.

Figure 6:
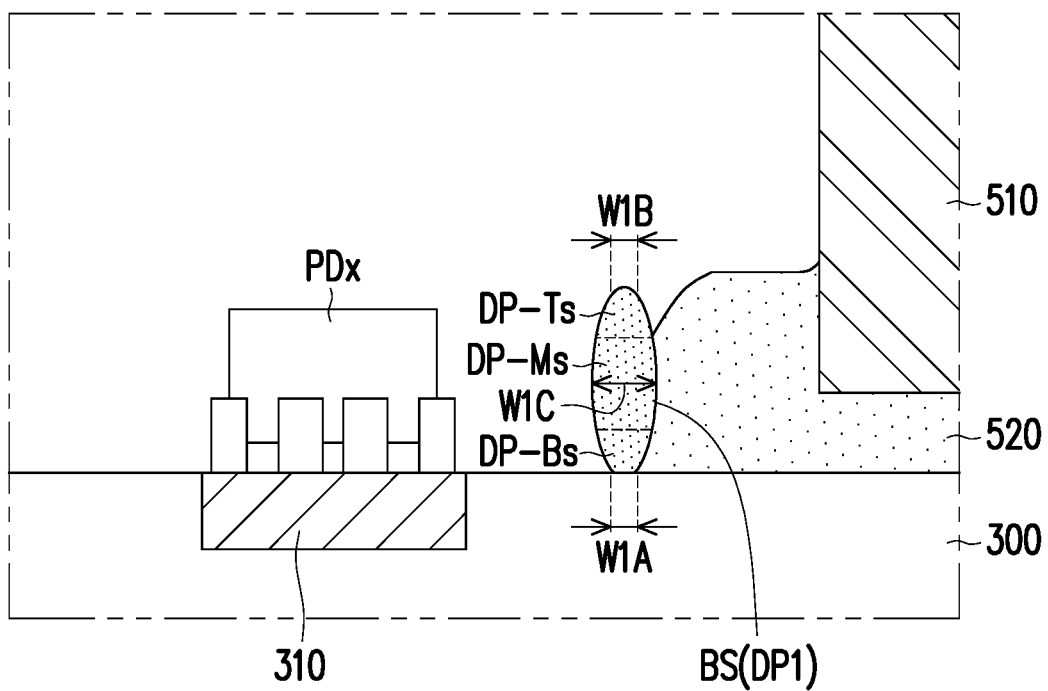
FIG. 6 is an enlarged sectional view of a package structure according to some other exemplary embodiments of the present disclosure.
Figure 7:
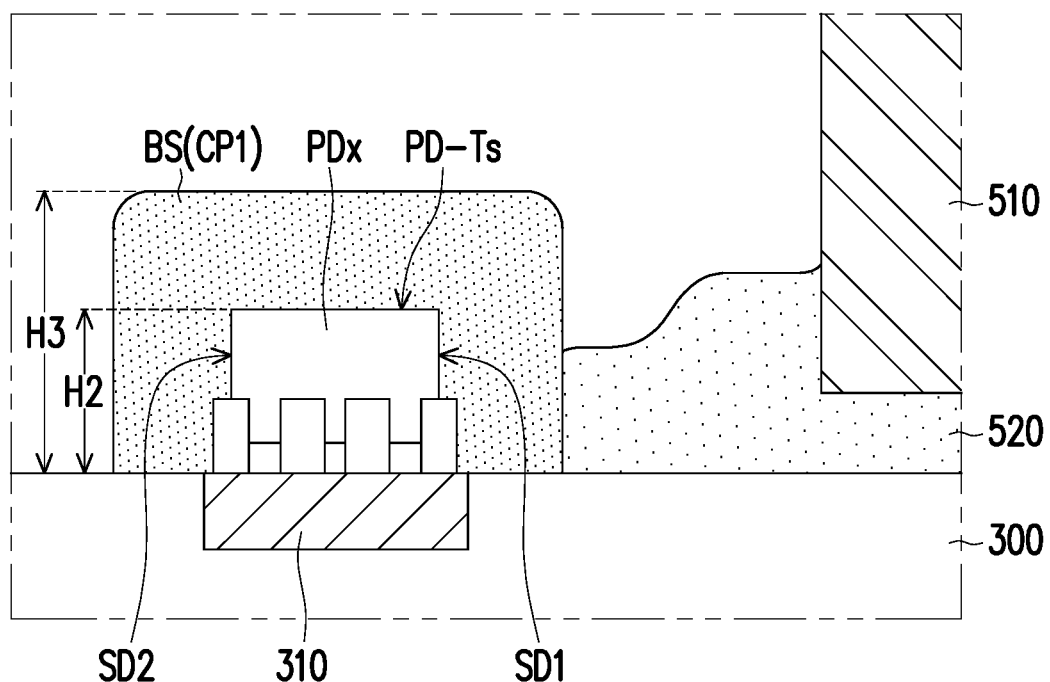
FIG. 7 is an enlarged sectional view of a package structure according to some other exemplary embodiments of the present disclosure.

FIG. 6 is an enlarged sectional view of a package structure according to some other exemplary embodiments of the present disclosure. The embodiment shown in FIG. 6 is similar to the embodiment shown in FIG. 3, hence the same reference numerals are used to refer to the same or liked parts, and its detailed description will not be repeated herein. As illustrated in FIG. 6, the first dam portion DP1 may include a bottom section DP-Bs, a middle section DP-Ms and a top section DP-Ts joined in sequence, and wherein the bottom section DP-Bs, the middle section DP-Ms and the top section DP-Ts are manufactured together in a single process. In the illustrated embodiment, a width of the first dam portions DP1 increases from the bottom section DP-Bs to the middle section DP-Ms, and the width decreases from the middle section DP-Ms to the top section DP-Ts. For example, in some embodiments, the bottom of the bottom section DP-Bs may have a width of W1A, the middle section DP-Ms may have a maximum width of W1C, while the top of the top section DP-TS may have a width of W1B. In certain embodiments, the width of the first dam portion DP1 increase from W1A to W1C, and decrease from W1C to W1B. Similar to the embodiments above, since the first dam portion DP1 prevents the spreading of the adhesive material 520 towards the passive device PDx, therefore, electrical failure and/or function failure of the passive device PDx may be prevented.

FIG. 7 is an enlarged sectional view of a package structure according to some other exemplary embodiments of the present disclosure. The embodiment shown in FIG. 7 is similar to the embodiment shown in FIG. 3, hence the same reference numerals are used to refer to the same or liked parts, and its detailed description will not be repeated herein. As illustrated in FIG. 7, the barrier structure BS may include a cover portion CP1 that covers side surfaces (first surface SD1, second surface SD2) and a top surface PD-Ts of the passive device PDx. In some embodiments, the passive device PDx is covered and enclosed by the cover portion CP1, while being in contact with the cover portion CP1. In some embodiments, the cover portion CP1 may be formed in a similar way to forming the dam portion DP1. For example, a polymer ink material IM (as shown in FIG. 2B) may be dispensed on the circuit substrate 300 to surround the passive device PDx, and cured to form the cover portion CP1. In some embodiments, a height H3 of the cover portion CP1 may be greater than the height H2 of the passive device PDx. In alternative embodiments, the height H3 of the cover portion CP1 may be substantially equal to the height H2 of the passive device PDx. Furthermore, in some embodiments, a width of the cover portion CP1 may be greater than or substantially equal to a width of the passive device PDx to enclose the passive device PDx. Similar to the embodiments above, since the cover portion CP1 also prevents the spreading of the adhesive material 520 towards the passive device PDx, therefore, electrical failure and/or function failure of the passive device PDx may be prevented. Furthermore, by protecting the top surface PD-Ts of the passive device PDx with the cover portion CP1, it may act to mitigate growth of tin whiskers from the passive devices PDx, hence preventing device failure due to a short circuit.

Figure 8:
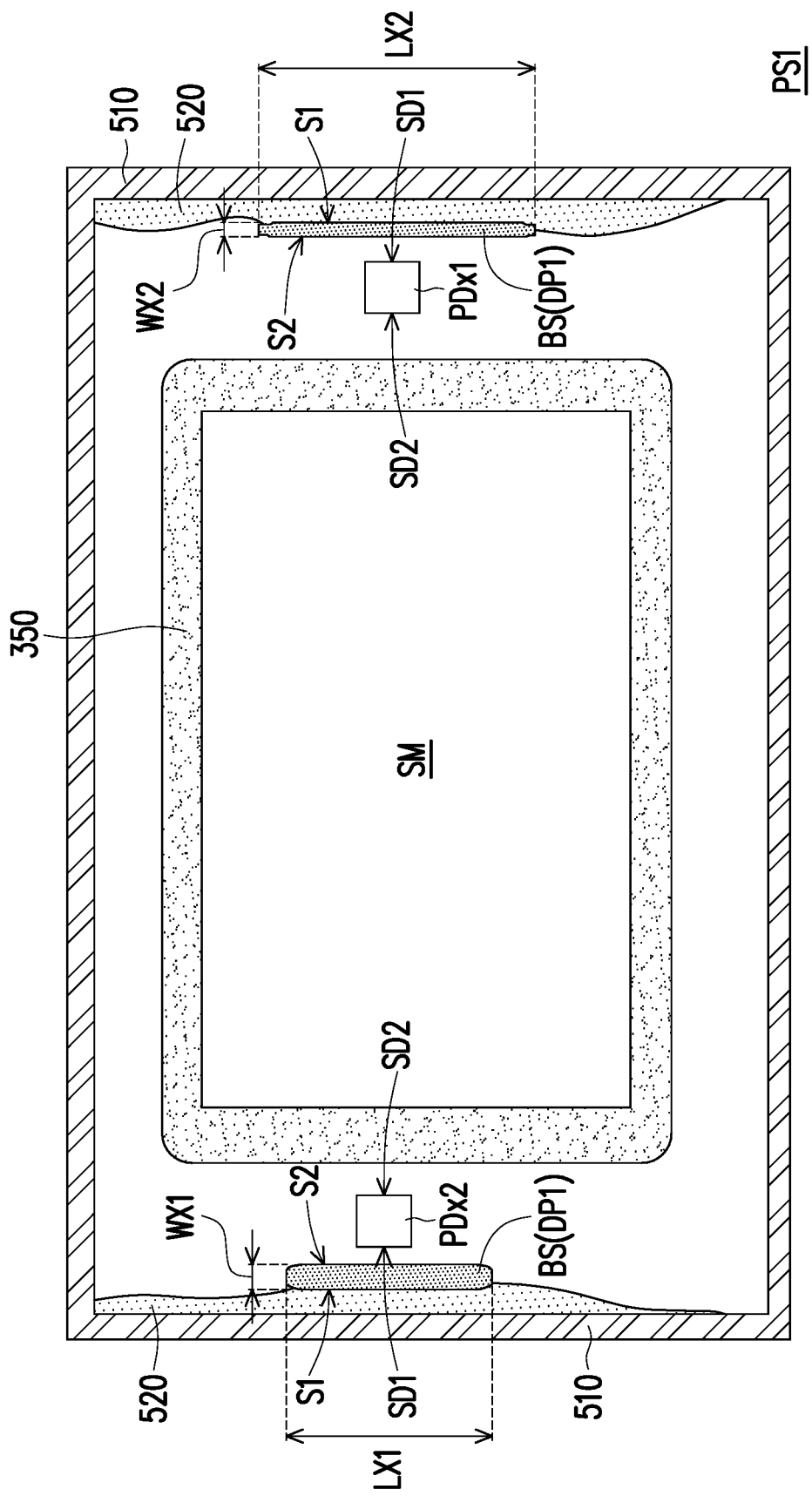
FIG. 8 is a top view of a package structure according to some exemplary embodiments of the present disclosure.

FIG. 8 is a top view of a package structure according to some exemplary embodiments of the present disclosure. The package structure PS1 illustrated in FIG. 8 is similar to the package structure PS illustrated in FIG. 2C, hence, the same reference numerals are used to refer to the same or liked parts, and its detailed description will not be repeated herein. As illustrated in FIG. 8, the package structure PS1 includes a first passive device PDx1 and a second passive device PDx2 located aside the semiconductor package SM, wherein barrier structures BS (first dam portions DP1) are provided in between the first passive device PDx1 and the lid structure 510, and in between the second passive device PDx2 and the lid structure 510. In some embodiments, the first dam portion DP1 located beside the first passive device PDx1 has a width WX2 and a length LX2, whereas the first dam portion DP1 located beside the second passive device PDx2 has a width WX1 and a length LX1. In the exemplary embodiment, the width WX1 is greater than the width WX2, and the length LX2 is greater than the length LX1. From the present embodiment, it can be known that the length and width of the first dam portion DP1 can be appropriately adjusted based on design requirement. In some embodiments, the design of the first dam portion DP1 may be appropriately adjusted as long as the first dam portion DP1 is successful in separating the passive devices (PDx1, PDx2) from the adhesive material 520. In the exemplary embodiment, the first dam portion DP1 is located at one side surface (first surface SD1) of the passive devices (PDx1, PDx2) to prevent the adhesive material 520 from spreading towards the passive devices (PDx1, PDx2). In certain embodiments, the first dam portion DP1 is located at the surface of the passive devices (PDx1, PDx2) most proximal to the lid structure 510.

Figure 9:
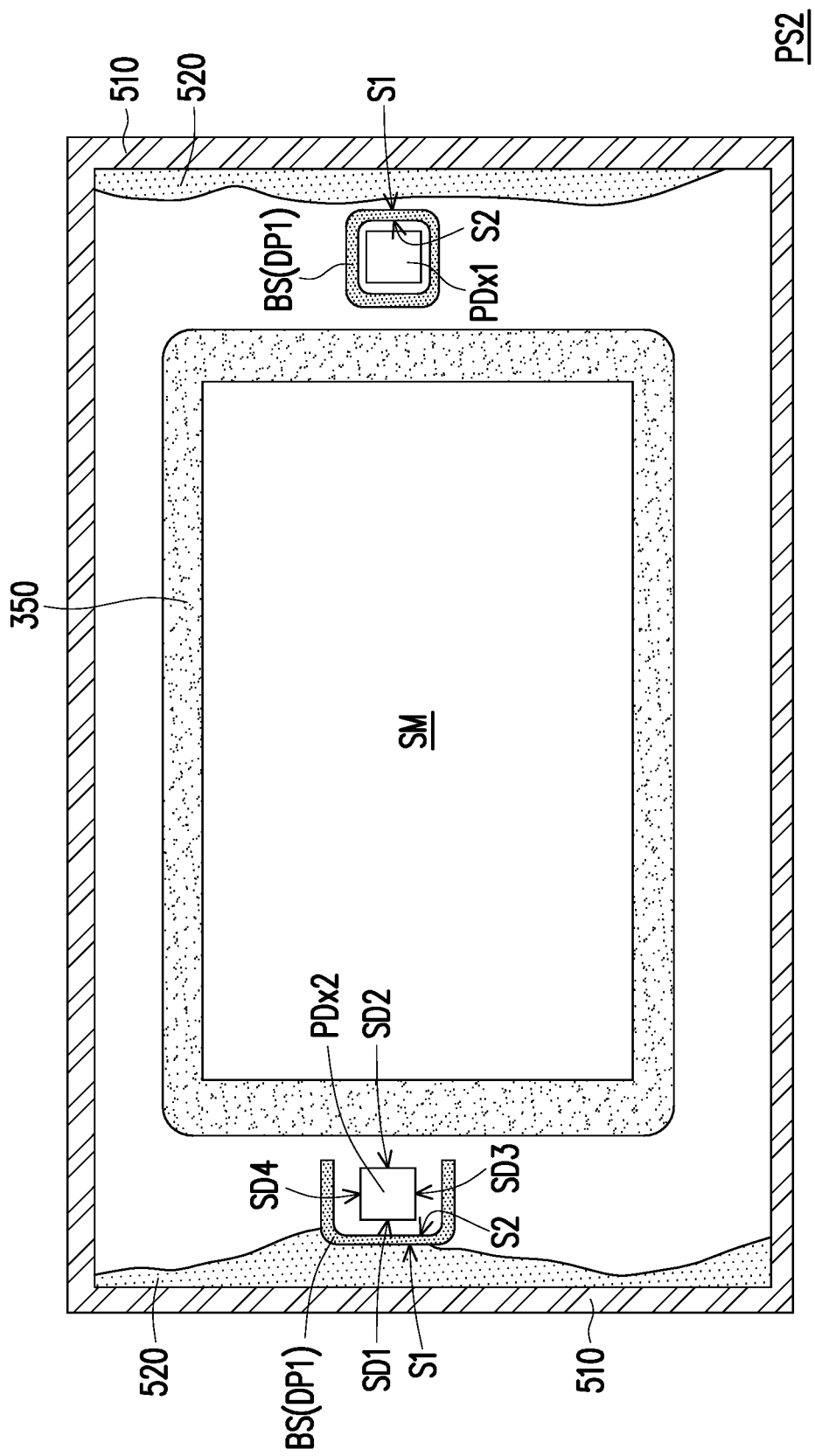
FIG. 9 is a top view of a package structure according to some other exemplary embodiments of the present disclosure.
Figure 10:
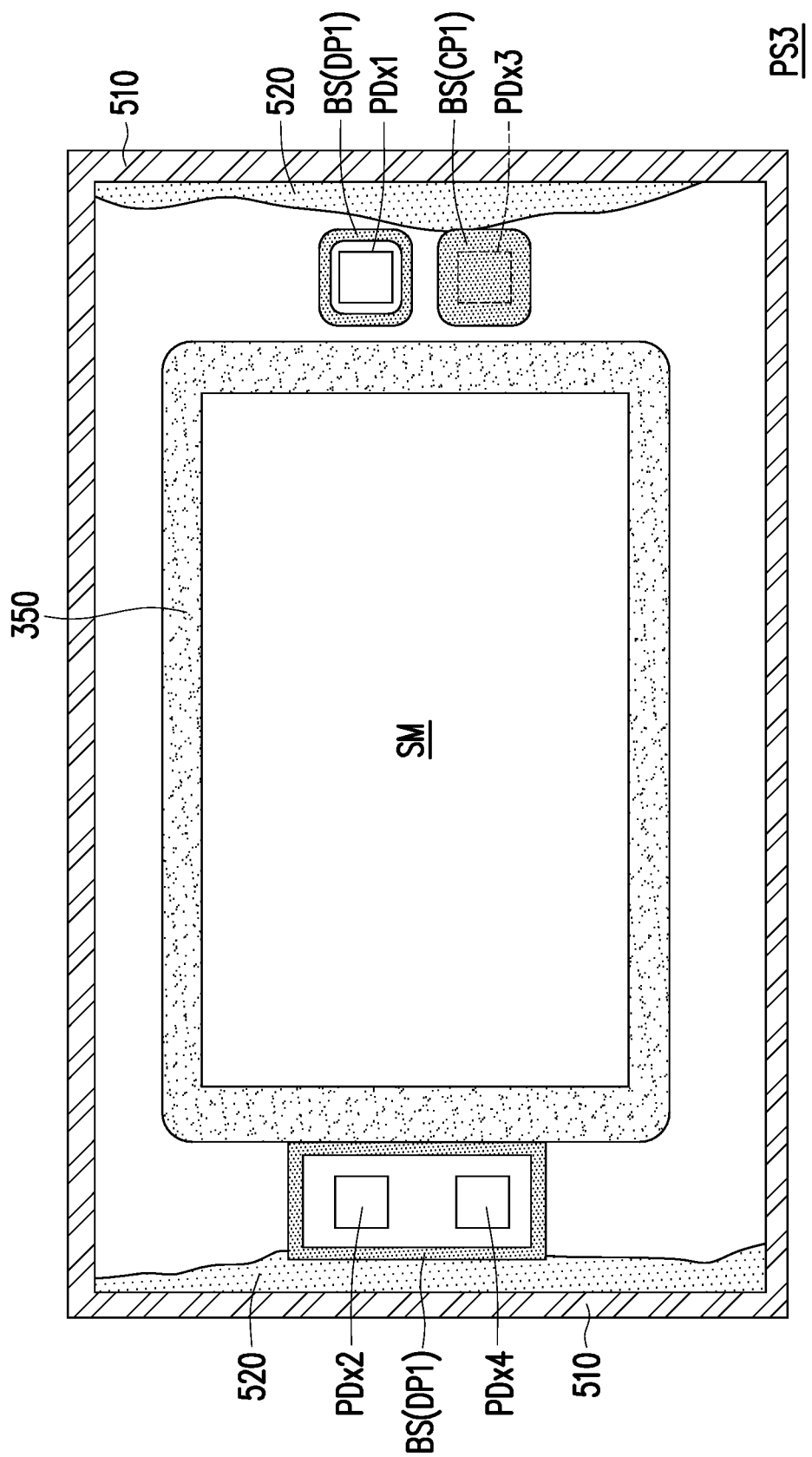
FIG. 10 is a top view of a package structure according to some other exemplary embodiments of the present disclosure.

FIG. 9 is a top view of a package structure according to some other exemplary embodiments of the present disclosure. The package structure PS2 illustrated in FIG. 9 is similar to the package structure PS1 illustrated in FIG. 8, hence, the same reference numerals are used to refer to the same or liked parts, and its detailed description will not be repeated herein. In the configuration shown in FIG. 8, the first dam portion DP1 is located at one side surface (first surface SD1) of the passive devices (PDx1, PDx2) to protect the passive devices (PDx1, PDx2). However, the disclosure is not limited thereto. For example, as illustrated in FIG. 9, in some embodiments, the first dam portion DP1 located aside the first passive device PDx1 is formed to surround all side surfaces of the first passive device PDx1. In certain embodiments, the first passive device PDx1 is confined to be located in an area surrounded by the first dam portion DP1. Furthermore, in certain embodiments, the first dam portion DP1 located aside the second passive device PDx2 is formed to surround a first surface SD1, a third surface SD3 and a fourth surface SD4 of the second passive device PDx2, while leaving the second surface SD2 exposed. Additionally, in the above embodiments, the adhesive material 520 is shown to contact a sidewall (e.g. first sidewall S1) of the first dam portion DP1. However, the disclosure is not limited thereto. For example, in some embodiments, when the first dam portion DP1 is kept a certain distance apart from the lid structure 510, then in some cases, the adhesive material 520 might not spread over to contact the first dam portion DP1. As illustrated in FIG. 9, the first sidewall S1 of the first dam portion DP1 located aside the first passive device PDx1 is not in contact with the adhesive material 520.

FIG. 10 is a top view of a package structure according to some other exemplary embodiments of the present disclosure. The package structure PS3 illustrated in FIG. 10 is similar to the package structure PS2 illustrated in FIG. 9, hence, the same reference numerals are used to refer to the same or liked parts, and its detailed description will not be repeated herein. In the above embodiments, the barrier structure BS includes a first dam portion DP1 or a cover portion CP1. However, the disclosure is not limited thereto, and the barrier structure BS may include both the first dam portion DP1 and the cover portion CP1 in a single package.

For example, as illustrated in FIG. 10, the package structure PS3 includes a first passive device PDx1, a second passive device PDx2, a third passive device PDx3 and a fourth passive device PDx4 located aside the semiconductor package SM. In some embodiments, barrier structures BS (first dam portions DP1 or cover portion CP1) are provided in between the passive devices (PDx1, PDx2, PDx3, PDx4) and the lid structure 510 to separate the passive devices (PDx1, PDx2, PDx3, PDx4) from the lid structure 510 and the adhesive material 520. In some embodiments, a first dam portion DP1 is surrounding all sidewalls of the first passive device PDx1. In some embodiments, a cover portion CP1 cover all side surfaces and top surface of the third passive device PDx3. Furthermore, in certain embodiments, another first dam portion DP1 may be surrounding sidewalls of both the second active device PDx2 and the fourth active device PDx3. In some embodiments, the underfill structure 350 is in contact with the first dam portion DP1 (barrier structure BS) located aside the second active device PDx2 and the fourth active device PDx3. That is, the barrier structure BS may also prevent a spreading of the underfill structure 350 towards the passive devices (PDx1, PDx2, PDx3, PDx4).

In the exemplary embodiment, four passive devices (PDx1, PDx2, PDx3, PDx4) are illustrated. However, the disclosure is not limited thereto, and the number of passive devices located in the package structure may be adjusted based on product requirement. Furthermore, it should be noted that each of the passive devices are protected from the spreading of the adhesive material 520 by using any one, or a combination of the various designs of the barrier structures BS described above.

Figure 11:
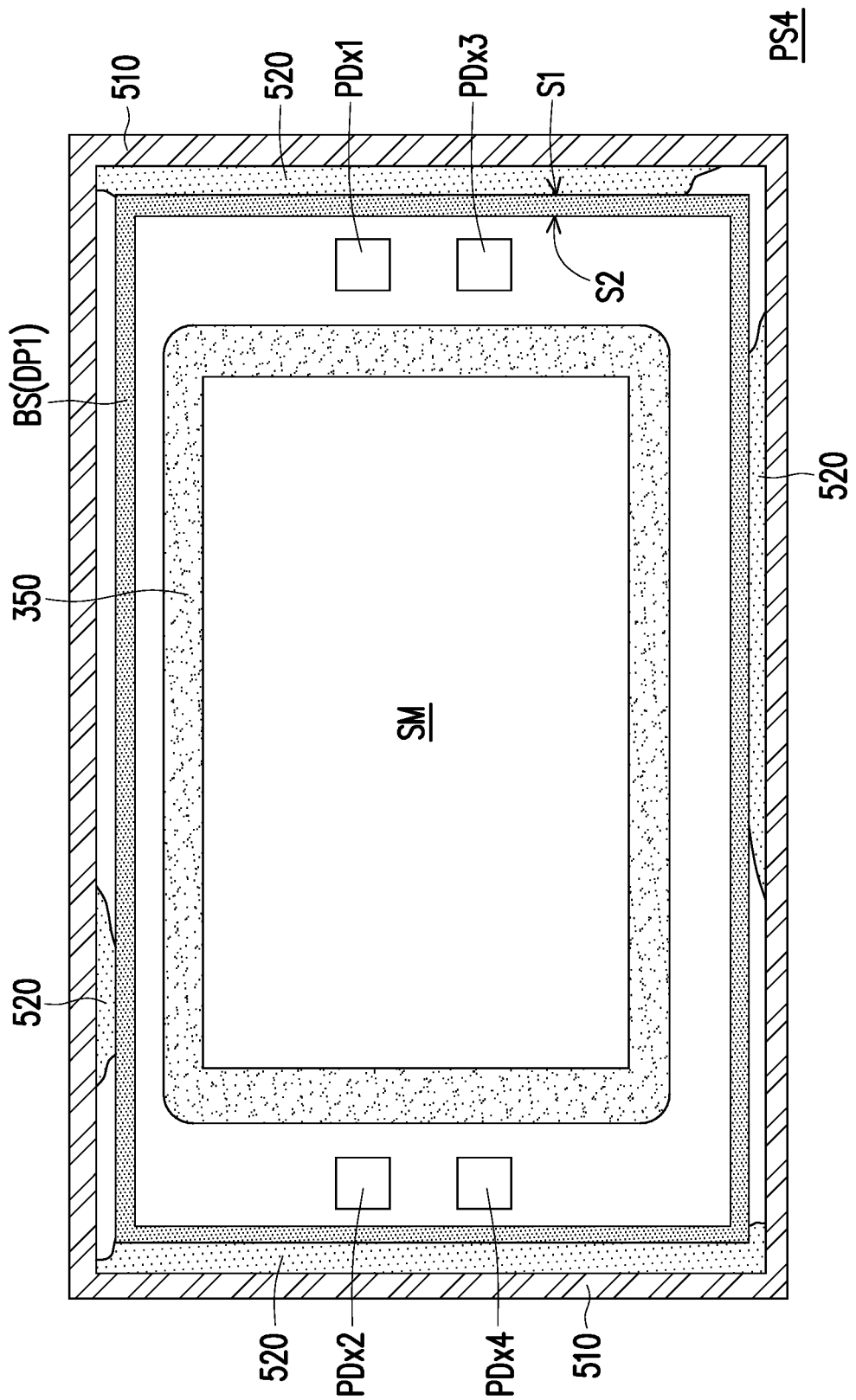
FIG. 11 is a top view of a package structure according to some other exemplary embodiments of the present disclosure.
Figure 12:
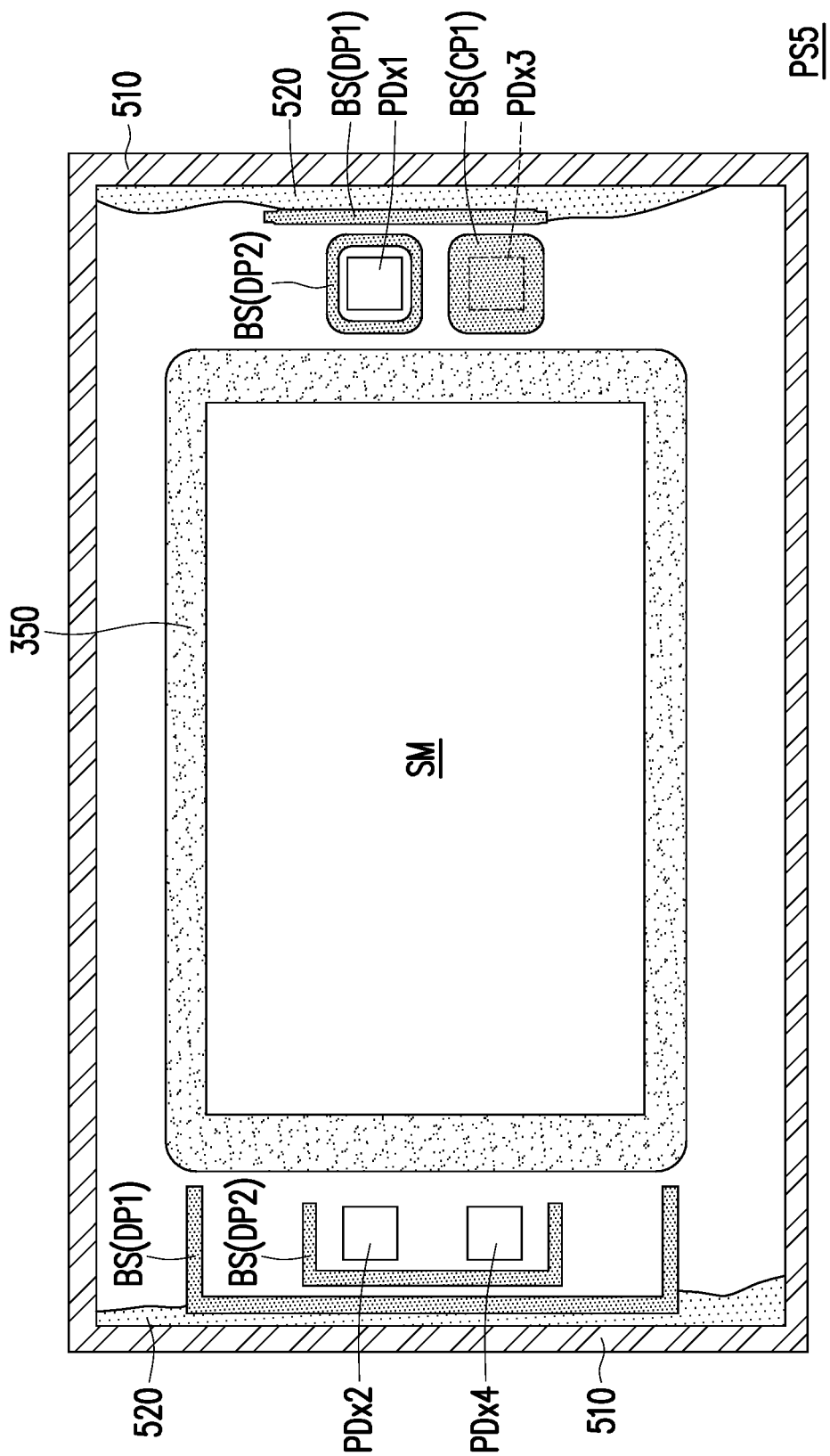
FIG. 12 is a top view of a package structure according to some other exemplary embodiments of the present disclosure.

FIG. 11 is a top view of a package structure according to some other exemplary embodiments of the present disclosure. The package structure PS4 illustrated in FIG. 11 is similar to the package structure PS3 illustrated in FIG. 10, hence, the same reference numerals are used to refer to the same or liked parts, and its detailed description will not be repeated herein. In the above embodiment, a plurality of barrier structures BS (first dam portions DM1 and/or cover portion CP1) are used to protect the plurality of passive devices. However, the disclosure is not limited thereto. For example, as illustrated in FIG. 11, a single first dam portion DP1 surrounding all of the passive devices (PDx1, PDx2, PDx3, PDx4) is provided. In some embodiments, the first dam portion DP1 surrounds and encircles all the passive devices (PDx1, PDx2, PDx3, PDx4) and the semiconductor package SM. In certain embodiments, the first dam portion DP1 has a first sidewall S1 (outer sidewall) that faces the lid structure 510, and a second sidewall S2 (inner sidewall) opposite to the first sidewall S1 that faces the passive devices (PDx1, PDx2, PDx3, PDx4). In some embodiments, the adhesive material 520 is in contact with the first sidewall S1 (outer sidewall). In other words, the spreading or bleeding of the adhesive material 520 is blocked by the first sidewall S1 of the first dam portion DP1.

FIG. 12 is a top view of a package structure according to some other exemplary embodiments of the present disclosure. The package structure PS5 illustrated in FIG. 12 is similar to the package structure PS3 illustrated in FIG. 10, hence, the same reference numerals are used to refer to the same or liked parts, and its detailed description will not be repeated herein. As illustrated in FIG. 12, the first dam portion DP1 located on one side of the first passive device PDx1 and the third passive device PDx3 is in contact with the adhesive material 520 to block the adhesive material 520. In some embodiments, a second dam portion DP2 is surrounding the first passive device PDx1 to further protect the first passive device PDx1. In certain embodiments, a cover portion CP1 is located aside the first dam portion DP1 to further protect and cover the third passive device PDx3. Similarly, the first dam portion DP1 and the second dam portion DP2 located aside the second passive device PDx2 and the fourth passive device PDx4 are formed to surround three sides of the passive devices (PDx2, PDx4). In certain embodiments, the second dam portion DP2 is located in between the first dam portion DP1 and the passive device PDx1 and spaced apart from the passive devices (PDx2, PDx4) and the first dam portion DP1. In some embodiments, the second dam portion DP2 are formed after forming the first dam portion DP1.

In the exemplary embodiment, similar to the method of forming the first dam portion DP1 and the cover portion CP1 as described previously, the second dam portion DP2 may be formed by further dispensing the polymer ink material IM (as described in FIG. 2B) on the circuit substrate 300 in an area located in between the first dam portion DP1 and the passive devices (PDx1, PDx2, PDx3, PDx4). In certain embodiments, after curing the polymer ink material IM, the barrier structure BS including a first dam portion DP1, a second dam portion DP1 and a cover portion CP1 is formed. In some embodiments, the second dam portion DP2 is separated from the first dam portion DP1 and the cover portion CP1. In certain embodiments, a height of the second dam portion DP2 is different than a height of the first dam portion DP1. However, the disclosure is not limited thereto, and the length, width, height and design of the dam portions (DP1, DP2) may be adjusted according to the previous embodiments. By using a second dam portion DP2, the protection of the passive devices (PDx1, PDx2, PDx3, PDx4) is further ensured. For example, in addition to the first dam portion DP1, the second dam portion DP2 may act as an extra barrier layer to increase the spreading route of the adhesive material 520 and prevent it from spreading towards the passive devices (PDx1, PDx2, PDx3, PDx4).

Figure 13:
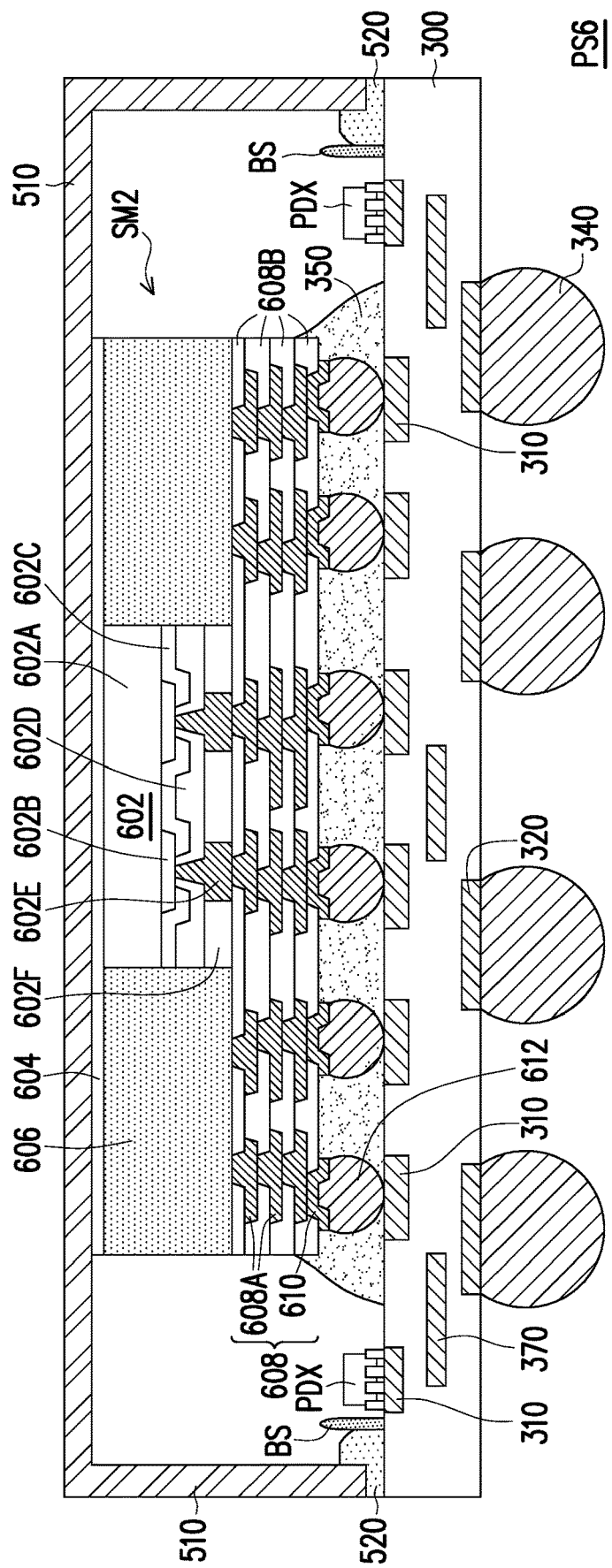
FIG. 13 is a schematic sectional view of a package structure according to some other exemplary embodiments of the present disclosure.

FIG. 13 is a schematic sectional view of a package structure according to some other exemplary embodiments of the present disclosure. The package structure PS6 illustrated in FIG. 13 is similar to the package structure PS illustrated in FIG. 2C, hence, the same reference numerals are used to refer to the same or liked parts, and its detailed description will not be repeated herein. As illustrated in FIG. 2C, the semiconductor package SM is directed to a chip-on-wafer (CoW) package. However, the disclosure is not limited thereto. For example, referring to FIG. 13, a semiconductor package SM2 is provided in replacement of the semiconductor package SM shown in FIG. 2C.

As shown in FIG. 13, the semiconductor package SM2 includes a semiconductor die 602, a dielectric layer 604, an insulating encapsulant 606, a redistribution layer 608, conductive pads 610 and conductive balls 612. The semiconductor die 602 is located on a dielectric layer 604. The insulating encapsulant 606 is located on the dielectric layer 604 and surrounding the semiconductor die 602. In some embodiments, the semiconductor die 602 includes a semiconductor substrate 602A, a plurality of conductive pads 602B, a passivation layer 602C, a post passivation layer 602D, a plurality of conductive posts or conductive vias 602E, and a protection layer 602F. As illustrated in FIG. 13, the plurality of conductive pads 602B is disposed on the semiconductor substrate 602A. The passivation layer 602C is formed over the semiconductor substrate 602A and has openings that partially expose the conductive pads 602B on the semiconductor substrate 602A. The semiconductor substrate 602A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 602B may be aluminum pads, copper pads or other suitable metal pads. The passivation layer 602C may be a silicon oxide layer, a silicon nitride layer, a silicon oxy-nitride layer or a dielectric layer formed of any suitable dielectric materials.

Furthermore, in some embodiments, the post-passivation layer 602D is optionally formed over the passivation layer 602C. The post-passivation layer 602D covers the passivation layer 602C and has a plurality of contact openings. The conductive pads 602B are partially exposed by the contact openings of the post passivation layer 602D. The post-passivation layer 602D may be a benzocyclobutene (BCB) layer, a polyimide layer, a polybenzoxazole (PBO) layer, or a dielectric layer formed by other suitable polymers. In some embodiments, the conductive posts or conductive vias 602E are formed on the conductive pads 602B by plating. In some embodiments, the protection layer 602F is formed on the post passivation layer 602D covering the conductive posts or conductive vias 602E so as to protect the conductive posts or conductive vias 602E. Although only one semiconductor die 602 is illustrated herein, however, it should be noted that the disclosure is not limited thereto, and the number of semiconductor die 602 in the semiconductor package SM2 can be more than one.

Furthermore, as illustrated in FIG. 13, the redistribution layer 608 is formed on the insulating encapsulant 606 and electrically connected to the semiconductor die 602. In some embodiments, the formation of the redistribution layer 608 includes sequentially forming one or more dielectric layers 608B, and one or more metallization layers 608A in alternation. In certain embodiments, the metallization layers 608A are sandwiched between the dielectric layers 608B. Although only three layers of the metallization layers 608A and four layers of dielectric layers 608B are illustrated herein, however, the scope of the disclose is not limited by the embodiments of the disclosure. In other embodiments, the number of metallization layers 608A and the dielectric layers 608B may be adjusted based on product requirement. In some embodiments, the metallization layers 608A are electrically connected to the conductive posts 602E of the semiconductor dies 602.

In some embodiments, a plurality of conductive pads 610 is disposed on an exposed top surface of the topmost layer of the metallization layers 608A for electrically connecting with conductive balls. In certain embodiments, the conductive pads 610 are for example, under-ball metallurgy (UBM) patterns used for ball mount. As shown in FIG. 13, the conductive pads 610 are formed on and electrically connected to the redistribution layer 608. In some embodiments, the materials of the conductive pads 610 may include copper, nickel, titanium, tungsten, or alloys thereof or the like, and may be formed by an electroplating process, for example. The number of conductive pads 610 are not limited in this disclosure, and may be selected based on the design layout. In some alternative embodiments, the conductive pads 610 may be omitted. In other words, conductive balls 612 formed in subsequent steps may be directly disposed on the redistribution layer 608.

As illustrated in FIG. 13, a plurality of conductive balls 612 is disposed on the conductive pads 608 and over the redistribution layer 610. In some embodiments, the conductive balls 612 may be disposed on the conductive pads 610 by a ball placement process or reflow process. In some embodiments, the conductive balls 612 are, for example, solder balls or ball grid array (BGA) balls. In some embodiments, the conductive balls 612 are connected to the redistribution layer 608 through the conductive pads 610. In certain embodiments, some of the conductive balls 612 may be electrically connected to the semiconductor die 602 through the redistribution layer 608. The number of the conductive balls 612 is not limited to the disclosure, and may be designated and selected based on the number of the conductive pads 610.

In the exemplary embodiment, the semiconductor package SM2 is disposed on the circuit substrate 300 by flip-chip bonding. In some embodiments, the semiconductor package SM2 is electrically connected to the contact pads 310 of the circuit substrate 300 through the conductive balls 612. In certain embodiments, the conductive balls 612 are further protected by the underfill structure 350. Similar to the embodiments above, since a barrier structure BS is provided on the circuit substrate 300 to prevent the spreading of the adhesive material 520 towards the passive device PDx, therefore, electrical failure and/or function failure of the passive device PDx may be prevented.

The package structure includes at least one barrier structure that separates the passive device from the lid structure and the adhesive material. As such, bleeding or spreading of the adhesive material towards the passive device may be avoided, thus the electrical failure and/or function failure of the passive device can be prevented. Furthermore, the barrier structure may act to protect the passive devices, and prevent tin (Sn) whiskers of the passive devices from touching the lid structure. In addition, by using the barrier structure, the enclosure widths between the passive device and the lid structure may be decreased, hence a larger semiconductor package may be mounted on the circuit substrate. Overall, a package structure having better reliability and performance can be obtained.

In some embodiments of the present disclosure, a package structure including a circuit substrate, a semiconductor package, a lid structure, a passive device and a barrier structure is provided. The semiconductor package is disposed on and electrically connected to the circuit substrate The lid structure is disposed on the circuit substrate covering the semiconductor package, wherein the lid structure is attached to the circuit substrate through an adhesive material. The passive device is disposed on the circuit substrate in between the semiconductor package and the lid structure. The barrier structure is separating the passive device from the lid structure and the adhesive material, wherein the barrier structure is in contact with the adhesive material.

In some other embodiments of the present disclosure, a package structure including a circuit substrate, an interposer structure, a plurality of semiconductor dies, a lid structure, a plurality of passive devices and a plurality of barrier structures is provided. The interposer structure is disposed on the circuit substrate and electrically connected to the circuit substrate. The plurality of semiconductor dies is disposed on the interposer structure and electrically connected to the interposer structure. The lid structure is disposed on the circuit substrate and surrounding the interposer structure and the plurality of semiconductor dies, wherein the lid structure is attached to the circuit substrate through an adhesive material. The plurality of passive devices is disposed on the circuit substrate in between the interposer structure and the lid structure, wherein the plurality of passive devices has a first surface that faces the lid structure, and a second surface opposite to the first surface that faces the interposer structure. The plurality of barrier structures is disposed on the circuit substrate in between the interposer structure and the lid structure, wherein the plurality of barrier structures separates the first surface of the plurality of passive devices from the lid structure and the adhesive material.

In yet another embodiment of the present disclosure, a method of fabricating a package structure is described. The method includes the following steps. A semiconductor package is disposed onto a circuit substrate. A passive device is disposed on the circuit substrate adjacent to the semiconductor package. A barrier structure is formed on the circuit substrate around the passive device by dispensing a polymer ink material on the circuit substrate and curing the polymer ink material to form the barrier structure. A lid structure is attached on the circuit substrate through an adhesive material, wherein the barrier structure separates the passive device from the lid structure and the adhesive material, and the lid structure is attached to the circuit substrate in a way that the adhesive material contacts the barrier structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate including contact pads;
   a package disposed on the substrate and electrically connected to the contact pads of the substrate through a plurality of conductive terminals;
   an underfill structure disposed in between the substrate and the package, wherein the underfill structure is covering the plurality of conductive terminals;
   a first passive device disposed on the substrate aside the package, wherein the first passive device is non-overlapped with the underfill structure in a thickness direction of the substrate; and
   a first dam portion disposed on the substrate and located at a same level surface with the plurality of conductive terminals on the substrate, wherein the first dam portion is directly contacting a top surface of the substrate and non-overlapped with the underfill structure in the thickness direction of the substrate, and the first dam portion includes a first section, a second section and a third section, a first sidewall of the first section and a second sidewall of the second section are facing one another and are extending along a first direction, and the first sidewall and the second sidewall are surrounding two opposing side surfaces of the first passive device, wherein the two opposing side surfaces of the first passive device are extending along the first direction and respectively facing the first sidewall and the second sidewall, the third section includes a third sidewall extending along a second direction, and the third sidewall physically joins the first sidewall of the first section to the second sidewall of the second section and surrounds a third side surface of the first passive device, wherein the second direction is perpendicular to the first direction, and the first dam portion uncovers a fourth side surface of the first passive device that is facing the package, and wherein disconnected ends of the first section and the second section include end terminal surfaces that are facing the underfill structure.

2. The structure according to claim 1, further comprising:
   a lid structure disposed on the substrate and attached to the substrate through an adhesive, wherein the adhesive is in physical contact with the first dam portion.

3. The structure according to claim 1, further comprising a second dam portion disposed on the substrate, wherein the second dam portion includes a first section, a second section and a third section, the first section and the second section of the second dam portion have sidewalls that are facing one another and are surrounding the two opposing side surfaces of the first passive device, the third section of the second dam portion physically joins the first section to the second section and surrounds the third side surface of the first passive device, and the second dam portion uncovers the fourth side surface of the first passive device that is facing the package, and wherein disconnected ends of the first section and the second section of the second dam portion include end terminal surfaces that are facing the underfill structure, and wherein the first dam portion surround the second dam portion.

4. The structure according to claim 1, further comprising:
   a second passive device and a third passive device disposed on the substrate aside the package; and
   an auxiliary first dam portion disposed on the substrate and extending along a first the second direction, wherein the auxiliary first dam portion is covering side surfaces of the second passive device and the third passive device, and a length of the auxiliary first dam portion along the second direction is smaller than a length of the underfill structure along the second direction.

5. The structure according to claim 4, further comprising:
   an auxiliary second dam portion encircling the second passive device; and
   a cover portion, wherein the third passive device is embedded in the cover portion.

6. The structure according to claim 5, wherein the auxiliary second dam portion and the cover portion are physically separated from the auxiliary first dam portion.

7. The structure according to claim 1, wherein the first dam portion comprises a bottom section, a middle section and a top section, and a width of the first dam portion increases from the bottom section to the middle section, and the width decreases from the middle section to the top section.

8. A structure, comprising:
   a circuit substrate;
   an interposer structure disposed on the circuit substrate;
   a lid structure attached to the circuit substrate and surrounding the interposer structure;
   a first passive device and a second passive device disposed on the circuit substrate in between the interposer structure and the lid structure;
   a first dam portion disposed in between the first passive device and the lid structure, and in between the second passive device and the lid structure, wherein the first dam portion includes a first side surface facing the lid structure, and a second side surface opposite to the first side surface and facing a first sidewall of the interposer structure, and the first side surface, the second side surface and the first sidewall are extending along a first direction; and
   a ring-shaped second dam portion disposed in between the first dam portion and the interposer structure, wherein the ring-shaped second dam portion includes four inner sidewalls that encircles the first passive device and four outer sidewalls opposite to the four inner sidewalls, wherein a first outer sidewall of the four outer sidewalls is facing the second side surface of the first dam portion, a second outer sidewall of the four outer sidewalls is facing the first sidewall of the interposer structure, the first outer sidewall and the second outer sidewall are extending along the first direction, and a length of the first outer sidewall is smaller than a length of the second side surface of the first dam portion along the first direction, and a length of the second outer sidewall is smaller than a length of the first sidewall of the interposer structure along the first direction.

9. The structure according to claim 8, wherein the interposer structure is electrically connected to the circuit substrate through a plurality of conductive terminals, and an underfill structure is surrounding the plurality of conductive terminals.

10. The structure according to claim 9, wherein the first side surface of the first dam portion is in contact with an adhesive material located below the lid structure.

11. The structure according to claim 8, wherein a height of the first dam portion is smaller than a height of the first passive device and smaller than a height of the second passive device.

12. The structure according to claim 8, further comprising a cover portion that surrounds the second passive device and covers a top surface of the second passive device.

13. The structure according to claim 8, further comprising:
a third passive device and a fourth passive device disposed on the circuit substrate in between the interposer structure and the lid structure, wherein the third passive device and the fourth passive device are separated from the first passive device and the second passive device by the interposer structure.

14. The structure according to claim 13, further comprising:
an auxiliary first dam portion disposed on the circuit substrate, wherein the auxiliary first dam portion includes a first section, a second section and a third section, the first section and the second section surround two opposing side surfaces of the third passive device and two opposing side surfaces of the fourth passive device, the third section physically joins the first section to the second section and surrounds third side surfaces of the third passive device and the fourth passive device, and the auxiliary first dam portion uncovers fourth side surfaces of the third passive device and the fourth passive device that are facing a second sidewall of the interposer structure, and wherein disconnected ends of the first section and the second section include end terminal surfaces that are facing the second sidewall of the interposer structure, wherein the second sidewall is opposite to the first sidewall of the interposer structure.

15. The structure according to claim 8, wherein a height of the ring-shaped second dam portion is different than a height of the first dam portion.

16. A structure, comprising:
a substrate;
a lid structure attached to the substrate through an adhesive;
a first passive device disposed on the substrate; and
a barrier structure separating the first passive device from the adhesive, wherein the barrier structure comprises a cover portion covering and contacting four side surfaces of the first passive device, and covering and contacting a top surface of the first passive device;
a first dam portion separating the barrier structure from the adhesive, wherein the first dam portion includes a bottom section, a middle section and a top section, the bottom section is directly contacting the substrate, the middle section is sandwiched in between the bottom section and the top section, and the top section is facing away from the substrate and separated from the substrate by the bottom section and the middle section, and from a sectional view of the first dam portion, a width of the first dam portion increases from the bottom section to the middle section along a first direction, and the width decreases from the middle section to the top section along the first direction, and the first direction is perpendicular to a top surface of the substrate.

17. The structure according to claim 16, wherein the first dam portion is in physical contact with the adhesive.

18. The structure according to claim 17, further comprising a second passive device disposed on the substrate, wherein the first dam portion is separating the first passive device and the second passive device from the adhesive.

19. The structure according to claim 18, further comprising a ring-shaped dam portion encircling the second passive device.

20. The structure according to claim 19, further comprising a semiconductor package disposed on the substrate aside the first passive device, and wherein from a top view of the structure, an area encircled by the ring-shaped dam portion is smaller than an area occupied by the semiconductor package.

* * * * *